(12) United States Patent
Lai et al.

(10) Patent No.: US 11,923,297 B2
(45) Date of Patent: Mar. 5, 2024

(54) APPARATUS AND METHODS FOR GENERATING A CIRCUIT WITH HIGH DENSITY ROUTING LAYOUT

(71) Applicant: Taiwan Semiconductor Manufacturing Co., Ltd., Hsinchu (TW)

(72) Inventors: Wei-An Lai, Hsinchu (TW); Shih-Wei Peng, Hsinchu (TW); Wei-Cheng Lin, Taichung (TW); Jiann-Tyng Tzeng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 246 days.

(21) Appl. No.: 17/242,056

(22) Filed: Apr. 27, 2021

(65) Prior Publication Data

US 2022/0344255 A1   Oct. 27, 2022

(51) Int. Cl.
*H01L 23/528* (2006.01)
*G06F 30/394* (2020.01)
(Continued)

(52) U.S. Cl.
CPC .......... *H01L 23/528* (2013.01); *G06F 30/394* (2020.01); *H01L 21/0259* (2013.01);
(Continued)

(58) Field of Classification Search
CPC .............. H01L 23/528; H01L 21/0259; H01L 21/823807; H01L 21/823814; H01L 21/823828; H01L 21/823864; H01L 21/823871; H01L 27/0922; H01L 29/0665; H01L 29/42392; H01L 29/66545; H01L 29/66553; H01L 29/66742;
(Continued)

(56) References Cited

U.S. PATENT DOCUMENTS

| 11,374,005 B2 * | 6/2022 | Peng ................. H01L 29/78618 |
| 2017/0098608 A1 * | 4/2017 | Jung ....................... H01L 23/50 |
| 2022/0108992 A1 * | 4/2022 | Yamagami ............ H01L 29/775 |

FOREIGN PATENT DOCUMENTS

| CN | 202261230 U | * | 5/2012 |
| CN | 104079273 A | * | 10/2014 |

(Continued)

*Primary Examiner* — Kimberly N Rizkallah
*Assistant Examiner* — Zhijun Xu
(74) *Attorney, Agent, or Firm* — Duane Morris LLP

(57) ABSTRACT

Apparatus and methods for generating a physical layout for a high density routing circuit are disclosed. An exemplary semiconductor structure includes: a gate structure; a plurality of first metal lines formed in a first dielectric layer below the gate structure; at least one first via formed in a second dielectric layer between the gate structure and the first dielectric layer; a plurality of second metal lines formed in a third dielectric layer over the gate structure; and at least one second via formed in a fourth dielectric layer between the gate structure and the third dielectric layer. Each of the at least one first via is electrically connected to the gate structure and a corresponding one of the plurality of first metal lines. Each of the at least one second via is electrically connected to the gate structure and a corresponding one of the plurality of second metal lines.

20 Claims, 26 Drawing Sheets

(51) Int. Cl.
   *H01L 21/02*      (2006.01)
   *H01L 21/8238*    (2006.01)
   *H01L 27/092*     (2006.01)
   *H01L 29/06*      (2006.01)
   *H01L 29/423*     (2006.01)
   *H01L 29/66*      (2006.01)
   *H01L 29/786*     (2006.01)
   *G06F 30/31*      (2020.01)
   *G06F 30/398*     (2020.01)

(52) U.S. Cl.
   CPC ............... *H01L 21/823807* (2013.01); *H01L 21/823814* (2013.01); *H01L 21/823828* (2013.01); *H01L 21/823864* (2013.01); *H01L 21/823871* (2013.01); *H01L 27/0922* (2013.01); *H01L 29/0665* (2013.01); *H01L 29/42392* (2013.01); *H01L 29/66545* (2013.01); *H01L 29/66553* (2013.01); *H01L 29/66742* (2013.01); *H01L 29/78618* (2013.01); *H01L 29/78696* (2013.01); *G06F 30/31* (2020.01); *G06F 30/398* (2020.01)

(58) Field of Classification Search
   CPC ......... H01L 29/78618; H01L 29/78696; H01L 27/0688; H01L 27/092; H01L 21/76895; H01L 23/5286; G06F 30/394; G06F 30/31; G06F 30/398; G06F 30/39; G06F 30/392
   See application file for complete search history.

(56) References Cited

FOREIGN PATENT DOCUMENTS

| CN | 111025114 A | * | 4/2020 | ......... G01R 31/2621 |
| WO | WO-2020255801 A1 | * | 12/2020 | .......... H01L 27/1108 |

* cited by examiner

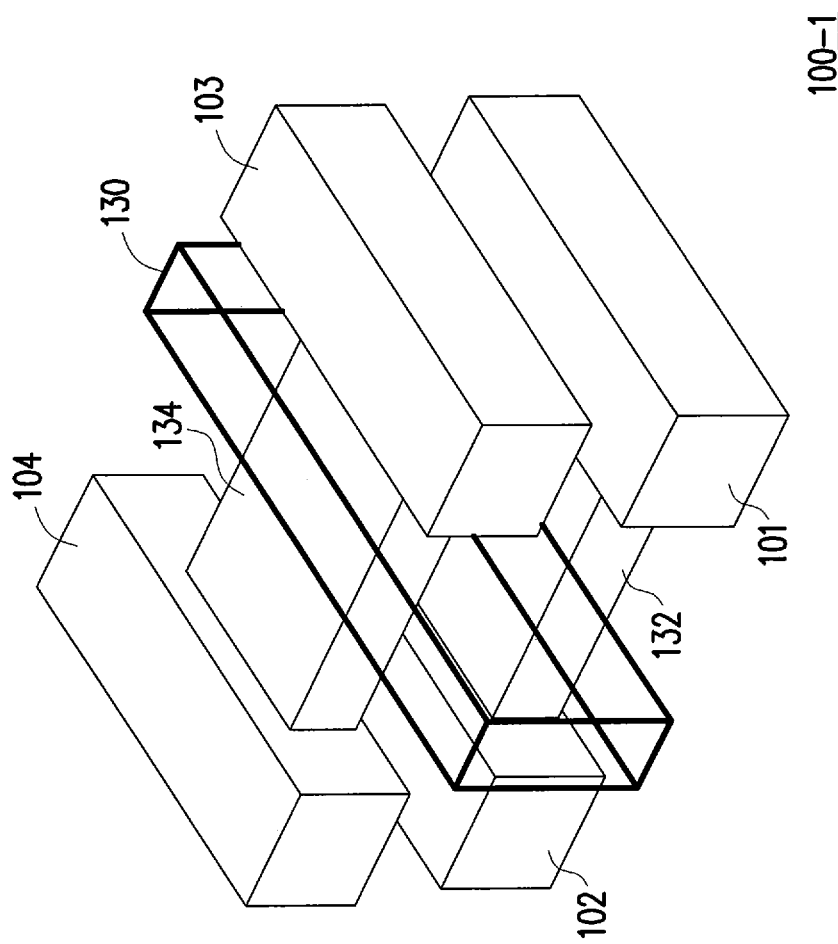
FIG. 1A
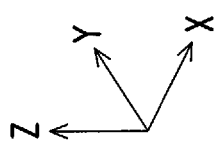

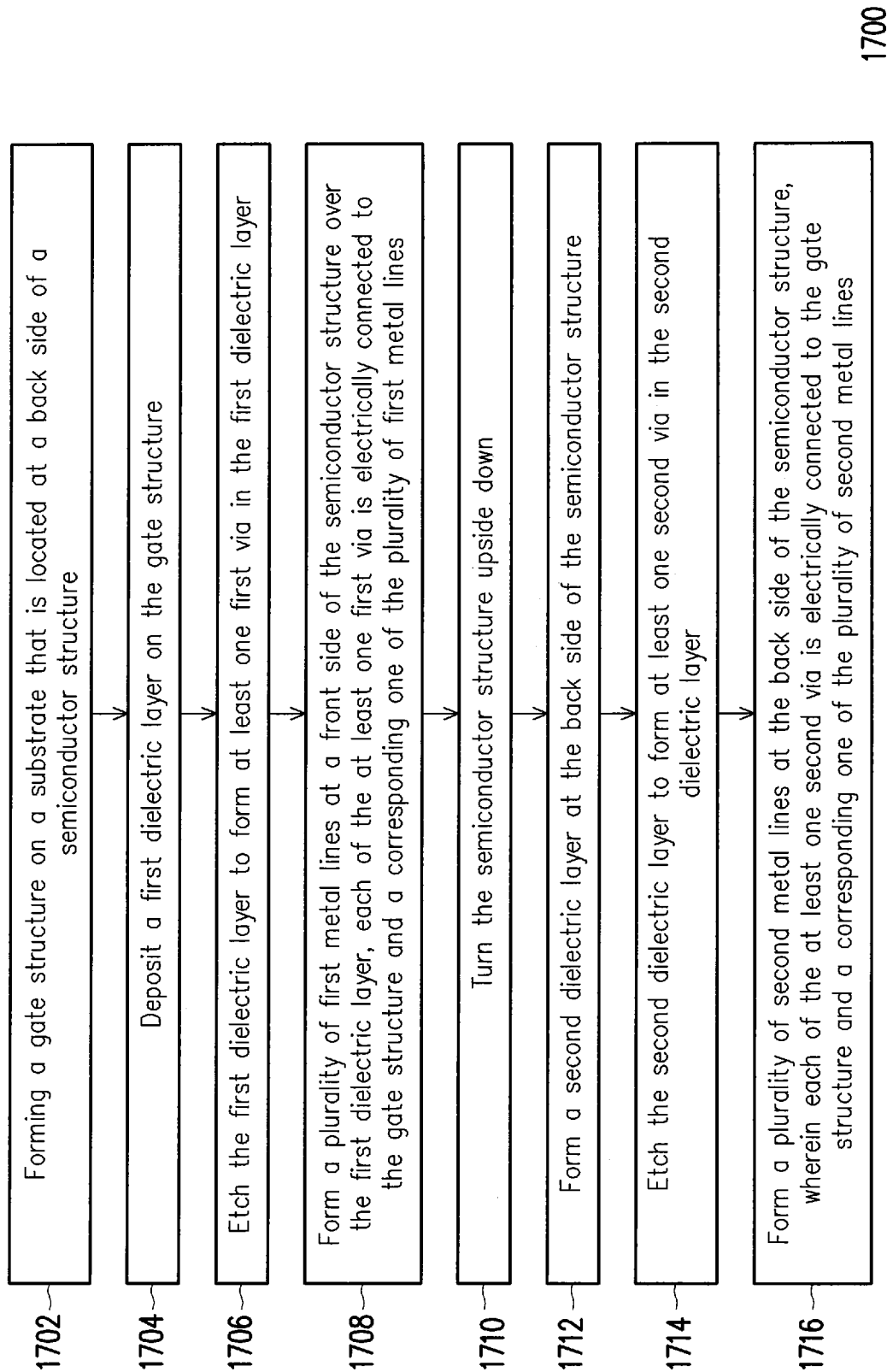

APPARATUS AND METHODS FOR GENERATING A CIRCUIT WITH HIGH DENSITY ROUTING LAYOUT

BACKGROUND

The semiconductor integrated circuit (IC) industry has experienced exponential growth. In modern integrated circuits, such as microprocessors, storage devices and the like, a very large number of circuit elements, e.g. transistors, are provided on a restricted chip area. Transistors come in a variety of shapes and forms, e.g., planar transistors, fin field-effect transistors (FinFETs), nanowire devices, etc. The transistors are typically either NFET or PFET type devices wherein the "N" and "P" designation is based upon the type of dopants used to create the source/drain regions of the devices.

While technological advances in IC materials and design produce generations of ICs, each generation has smaller and more complex circuits than the previous generation. For example, while a conventional FET is a planar device wherein the entire channel region of the device is formed parallel and slightly below the planar upper surface of the substrate, a complementary-FET (CFET) device has been proposed to push conventional standard cell height scaling down, by utilizing a three-dimensional (3D) monolithic structure having NFET and PFET nanowires/nanosheets vertically stacked on top of each other. A CFET layout typically has P-type FETs on one-level and N-type FETs on an adjacent level (i.e., above or below). In such structures, the source/drain regions of the lower FET are electrically isolated from the source/drain regions of the upper FET by dielectric layers. But existing CFET layouts have all routing resources on a front side of the device, which will impact a density of the CFET design.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

FIG. 1A illustrates a perspective view of an exemplary complementary-FET, in accordance with some embodiments of the present teaching.

FIG. 17 illustrates a flow diagram of a method for forming a semiconductor device with metal lines on both sides, in accordance with some embodiments of the present teaching.

DETAILED DESCRIPTION

Figure 1B:
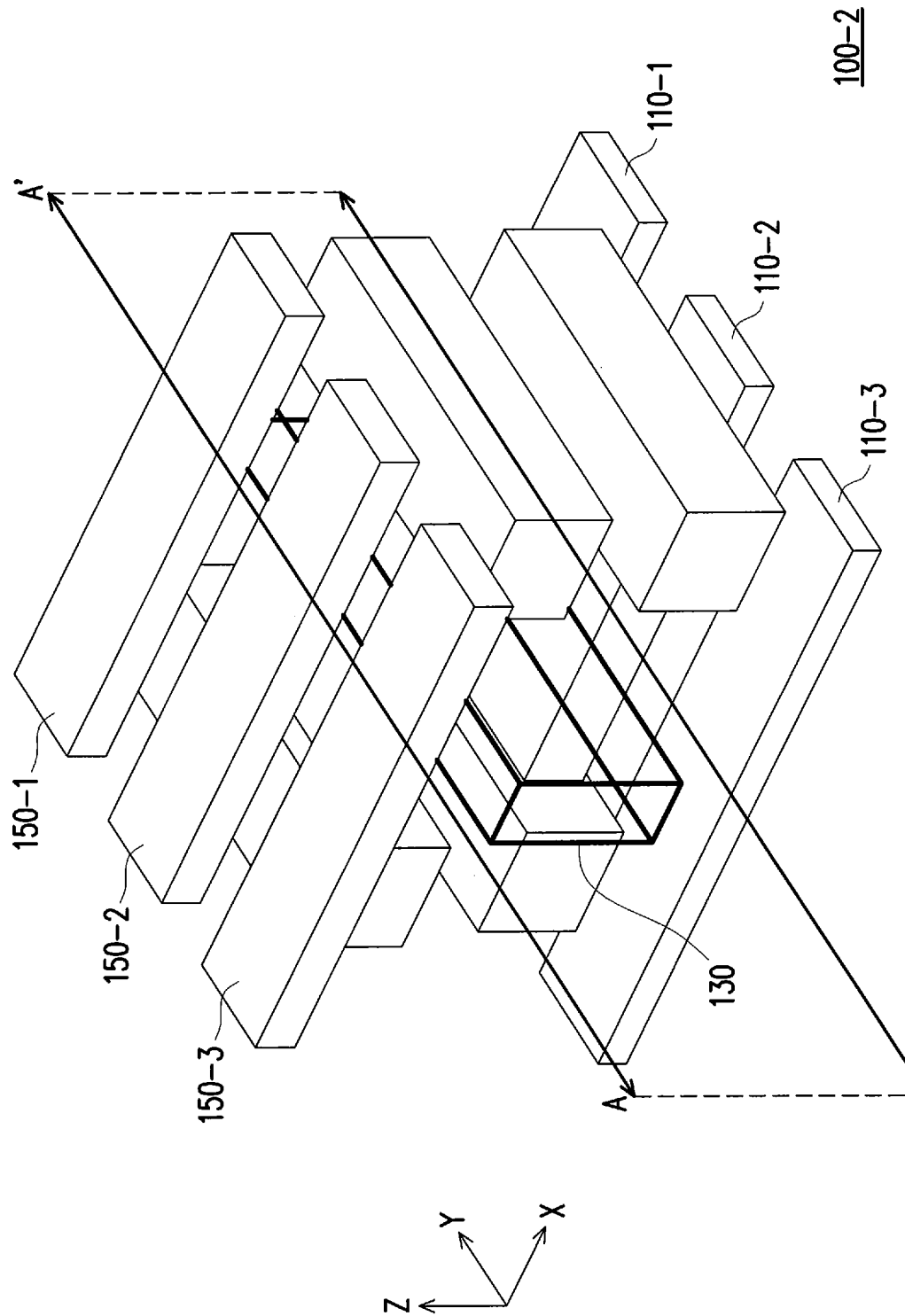
FIG. 1B illustrates a perspective view of an exemplary complementary-FET with metal lines on both sides, in accordance with some embodiments of the present teaching.

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Electronic Design Automation (EDA) tools and methods are often used in the design and placement of integrated circuits on a semiconductor wafer. Generally application-specific integrated circuits (ASICs) are formed from transistors into primitive circuits that perform basic logical operations such as AND, OR, NAND, NOT, NOR, etc. These primitive circuits can then be organized into macro circuits such as multiplexers, adders, multipliers, decoders, etc., which in turn, are organized as functional blocks.

A complementary-FET (CFET), designed without back end of line (BEOL) routing resources would lose some routing resources compared to a planar transistor. To recover the loss of routing resources and improve design density at the same time, the present teaching discloses a three-dimensional (3D) device including CFETs, with both front side routing and back side routing enabled. In some embodiments, a CFET disclosed herein has metal lines formed both above and below the gate structure of the CFET, such that input/output (I/O) pins of the CFET or any device comprising a CFET can be routed from either side of the CFET. A CFET standard cell, following a disclosed design, have each I/O pin routed from a front side, a back side, or dual sides of the cell. While area and cell height are reduced from planar transistor to CFET, the number of metal lines can be used for routing is also reduced on one side of a cell. With both front side routing and back side routing enabled, a CFET cell can achieve high design density without losing routing resources.

In some embodiments, a cell swap method is disclosed to generate a physical layout of a circuit, to avoid pin access issue and/or routing congestion issue of the circuit design. For example, when a distance between two I/O pins or two metal lines of two respective adjacent cell structures is smaller than a predetermined threshold, a cell swap may be performed on one of the two adjacent cell structures to change its connection routing side, from front side to back side or from back side to front side.

FIG. 1A illustrates a perspective view of an exemplary complementary-FET 100-1, in accordance with some embodiments of the present teaching. As illustrated in FIG. 1A, the exemplary complementary-FET 100-1 may include two FETs stacked vertically along the Z direction. In this example, the upper FET includes a source structure 104 and a drain structure 103 connected by a channel 134; while the lower FET includes a source structure 102 and a drain structure 101 connected by a channel 132. The complementary-FET 100-1 also includes a gate structure 130 surrounding both the channel 134 and the channel 132. That is, the gate structure 130 is a gate structure for both the upper FET and the lower FET of the complementary-FET 100-1. In various embodiments, the positions of the source structures and drain structures can be exchanged without going beyond the scope of the present teaching.

In some embodiments, the upper FET and the lower FET are of opposite types. That is, one of the channel 134 or channel 132 includes an n-type semiconductor material including one or more donor dopants and the other of the channel 134 or channel 132 includes a p-type semiconductor material including one or more acceptor dopants. Therefore, the channel 134 and channel 132 include separate or opposite types of semiconductor materials. In other embodiments, each of the channel 134 or channel 132 includes a same n-type or p-type semiconductor material. The two FETs positioned vertically shown in FIG. 1A can be referred to as an active region of the complementary-FET.

FIG. 1B illustrates a perspective view of an exemplary complementary-FET 100-2 with metal lines on both sides, in accordance with some embodiments of the present teaching. As illustrated in FIG. 1B, the exemplary complementary-FET 100-2 may include an active region, which includes two FETs stacked vertically along the Z direction as shown in FIG. 1A before, and metal lines above and below the active region. For example, a plurality of first metal lines 110-1, 110-2, 110-3 are formed below the active region; while a plurality of second metal lines 150-1, 150-2, 150-3 are formed above the active region, as shown in FIG. 1B.

As illustrated in FIG. 1B, while the gate structure 130 extends along the Y direction, the plurality of first metal lines 110-1, 110-2, 110-3 extend along the X direction. That is, the plurality of first metal lines 110-1, 110-2, 110-3 are formed perpendicular to the gate structure 130. In addition, the plurality of second metal lines 150-1, 150-2, 150-3 also extend along the X direction and are formed in parallel with the plurality of first metal lines 110-1, 110-2, 110-3.

Figure 1C:
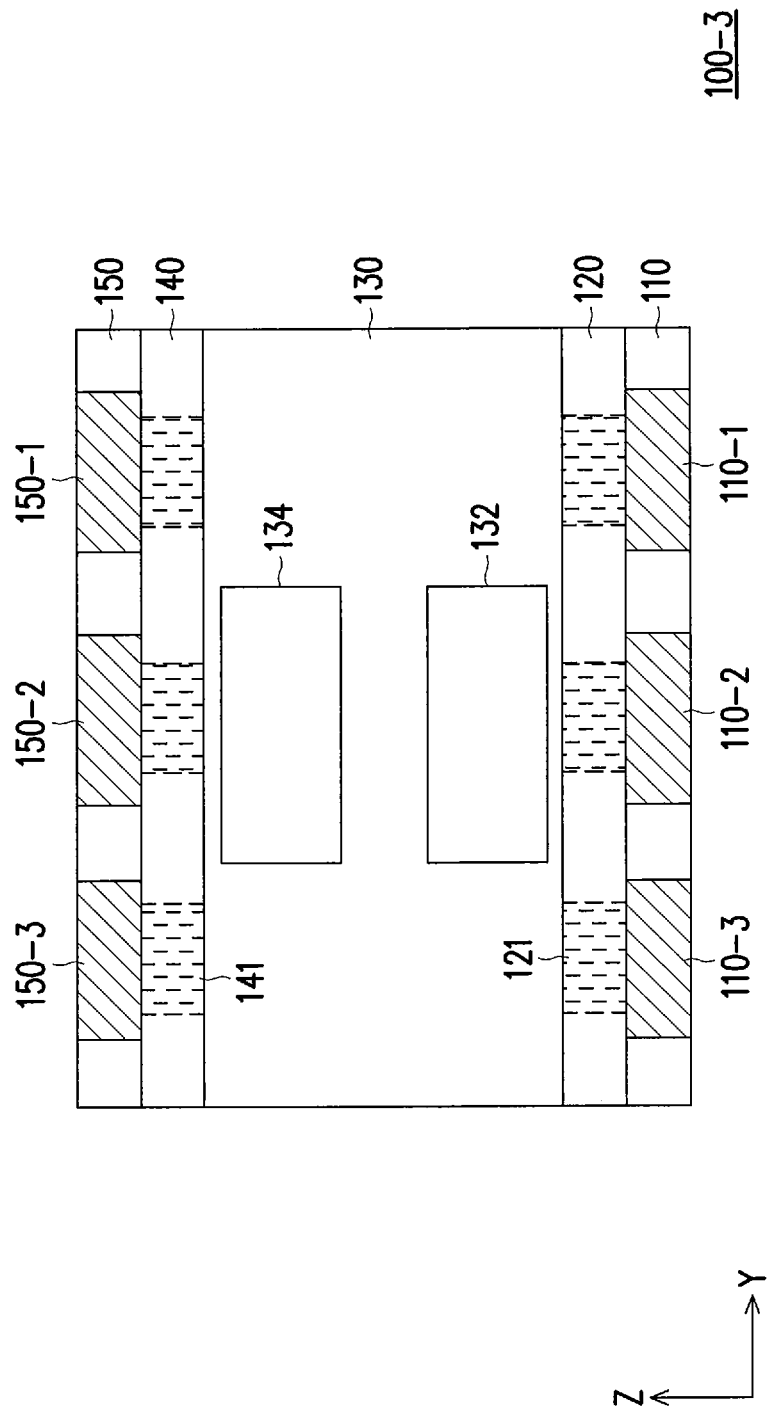
FIG. 1C illustrates a cross sectional view of an exemplary complementary-FET with metal lines on both sides, in accordance with some embodiments of the present teaching.

FIG. 1C illustrates a cross sectional view of the exemplary complementary-FET 100-3 with metal lines on both sides, along the lines A-A' shown in FIG. 1B, in accordance with some embodiments of the present teaching. As shown in FIG. 1C, the complementary-FET 100-3 includes a gate structure 130; a plurality of first metal lines 110-1, 110-2, 110-3 formed in a first dielectric layer 110 below the gate structure 130; and a second dielectric layer 120 that is between the gate structure 130 and the first dielectric layer 110; a plurality of second metal lines 150-1, 150-2, 150-3 formed in a third dielectric layer 150 over the gate structure 130; and a fourth dielectric layer 140 that is between the gate structure 130 and the third dielectric layer 150. In various embodiments, each of the first dielectric layer 110, the second dielectric layer 120, the third dielectric layer 150 and the fourth dielectric layer 140 can be formed using undoped silica glass (USG), fluorinated silica glass (FSG), a low-k material, an extremely low-k dielectric, other suitable materials, and/or combinations thereof.

Referring to FIG. 1B and FIG. 1C, the upper side of the active region may be called a front side of the CFET, while the lower side of the active region may be called a back side of the CFET. In some embodiments, the plurality of first metal lines 110-1, 110-2, 110-3 are metal 0 lines at a back side of the active region; while the plurality of second metal lines 150-1, 150-2, 150-3 are metal 0 lines at a front side of the active region. As discussed before, the channels 132, 134 surrounded by the gate structure 130 are stacked vertically along the Z direction, and may have different types of semiconductor material.

The complementary-FET 100-3 may optionally include at least one first via 121 formed in the second dielectric layer 120. Each of the at least one first via 121 is electrically connected to the gate structure 130 and a corresponding one of the plurality of first metal lines. In addition, the complementary-FET 100-3 may optionally include at least one second via 141 formed in the fourth dielectric layer 140. Each of the at least one second via 141 is electrically connected to the gate structure 140 and a corresponding one of the plurality of second metal lines. Each via 121, 141 may be optionally formed and used to route signal in and/or out of the active region through a corresponding metal line. While not every via has to be formed, the complementary-FET 100-3 has options to route signals in and/or out of the active region through the front side and/or the back side.

Figure 2A:
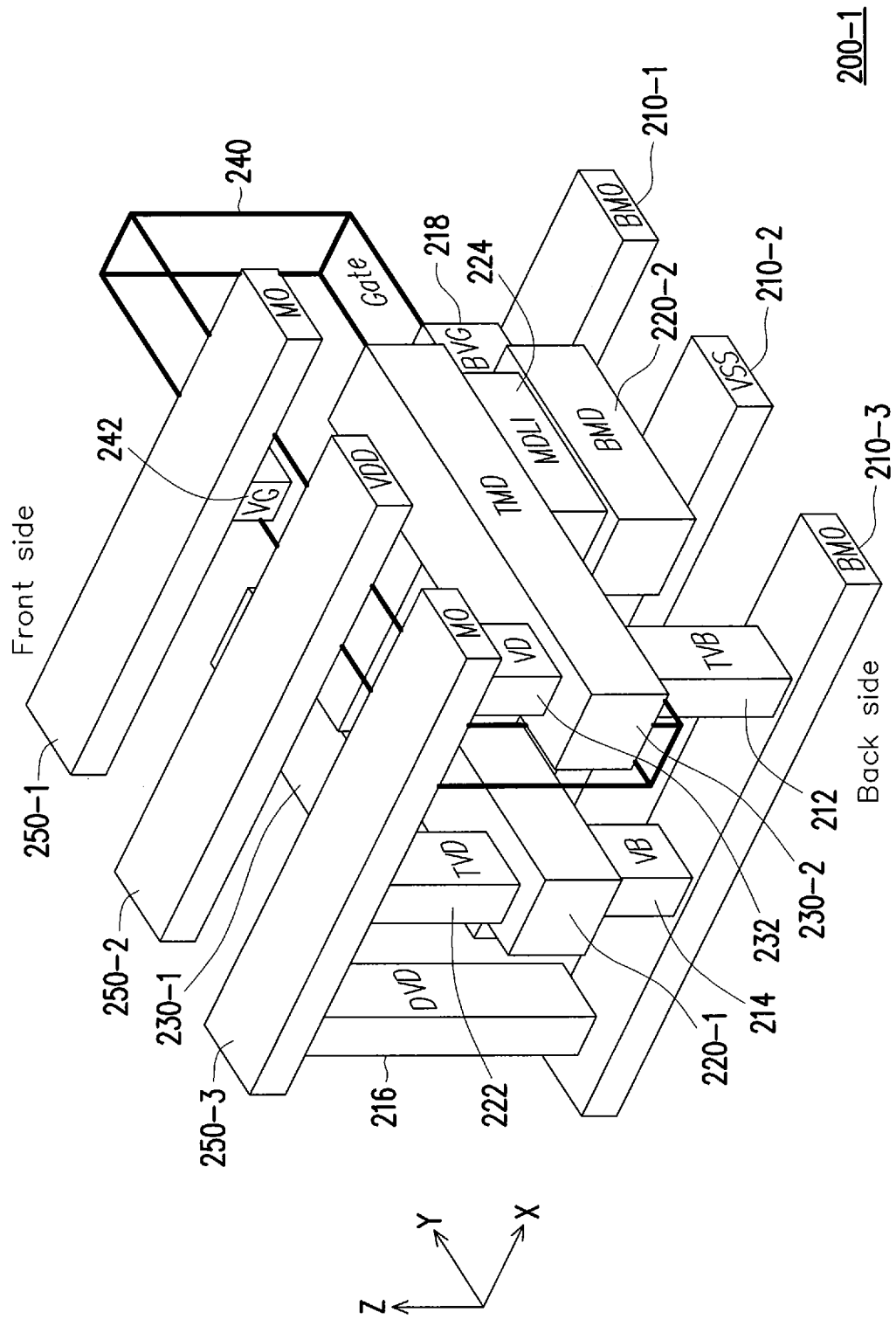
FIG. 2A illustrates a perspective view of different layers of an exemplary complementary-FET, in accordance with some embodiments of the present teaching.

FIG. 2A illustrates a perspective view of different layers of an exemplary complementary-FET 200-1, in accordance with some embodiments of the present teaching. As shown in FIG. 2A, the complementary-FET 200-1 includes an active region including a gate structure 240 surrounding a top metallization dielectric (TMD) layer 230-1, 230-2 and a bottom metallization dielectric (BMD) layer 220-1, 220-2 of two transistors respectively. In one example, the TMD layer is a p-channel metal-oxide-semiconductor (PMOS) MD layer at the top level; while the BMD layer is an n-channel metal-oxide-semiconductor (NMOS) MD layer at the bottom level. In another example, the TMD layer is an NMOS MD layer at the top level; while the BMD layer is a PMOS MD layer at the bottom level.

Figure 2B:
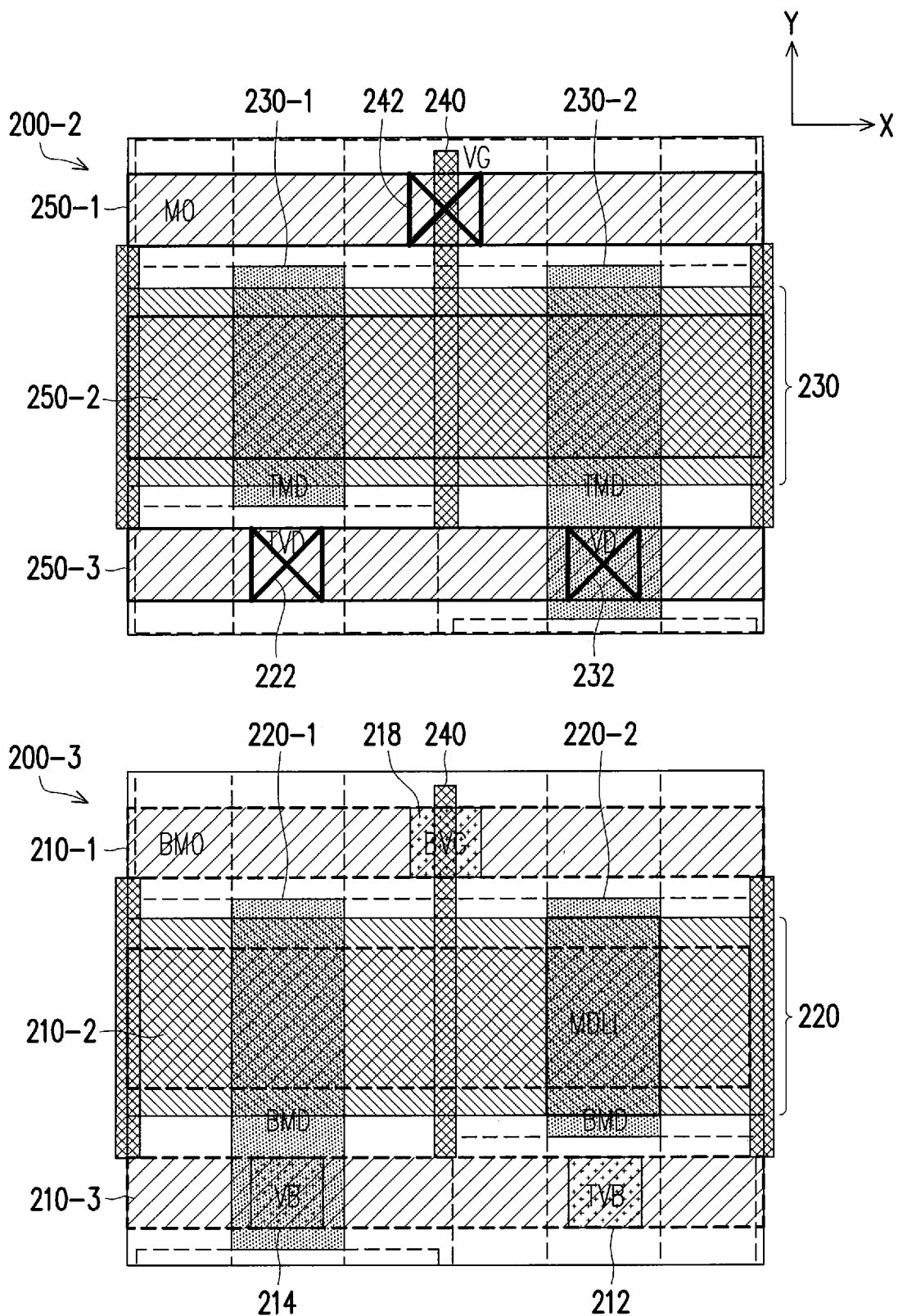
FIG. 2B illustrates top views of a front side and a back side of an exemplary complementary-FET, in accordance with some embodiments of the present teaching.

The two transistors are stacked vertically along the Z direction to form the complementary-FET, and share the same gate structure 240. FIG. 2B illustrates top views of a front side and a back side of the exemplary complementary-FET shown in FIG. 2A, in accordance with some embodiments of the present teaching. To be specific, the top view 200-2 of the front side of the complementary-FET shows an active region 230 of the upper transistor, while the top view 200-3 of the back side of the complementary-FET shows an active region 220 of the lower transistor. Without specific reference, the "active region" disclosed herein refers to both the active region 220 and the active region 230 of the complementary-FET.

As shown in FIG. 2A, the complementary-FET 200-1 further includes a plurality of first metal lines 210-1, 210-2, 210-3 formed in a bottom metal 0 (BM0) layer at the back side of the active region; and includes a plurality of second metal lines 250-1, 250-2, 250-3 formed in a metal 0 (M0) layer at the front side of the active region. In some embodiments, the M0 layer refers to a first metal layer at the front side of the active region; and the BM0 layer refers to a first metal layer at the back side of the active region. In this example, one of the first metal lines, e.g. the metal line 210-2, is electrically connected to a logic low power supply or negative power supply (VSS); and one of the second metal lines, e.g. the metal line 250-2, is electrically connected to a logic high power supply or positive power supply (VDD).

In some embodiments, the complementary-FET 200-1 may also include a via VB 214 that connects the BMD layer 220-1 and the BM0 layer 210-3. In some embodiments, the complementary-FET 200-1 may also include a tall VB (TVB) via 212 that connects the TMD layer 230-2 and the BM0 layer 210-3. In some embodiments, the complementary-FET 200-1 may also include a via VD 232 that connects the TMD layer 230-2 and the M0 layer 250-3. In some embodiments, the complementary-FET 200-1 may also include a tall VD (TVD) via 222 that connects the BMD layer 220-1 and the M0 layer 250-3. In some embodiments, the complementary-FET 200-1 may also include a deep VD (DVD) via 216 that connects the M0 layer 250-3 and the BM0 layer 210-3.

In some embodiments, the complementary-FET 200-1 may also include a via VG 242 that connects the gate structure 240 and the M0 layer 250-1. In some embodiments, the complementary-FET 200-1 may also include a via BVG 218 that connects the gate structure 240 and the BM0 layer 210-1. In some embodiments, the complementary-FET 200-1 may also include a via MDLI 224 between the TMD layer 230-2 and the BMD layer 220-2.

Figure 3A:
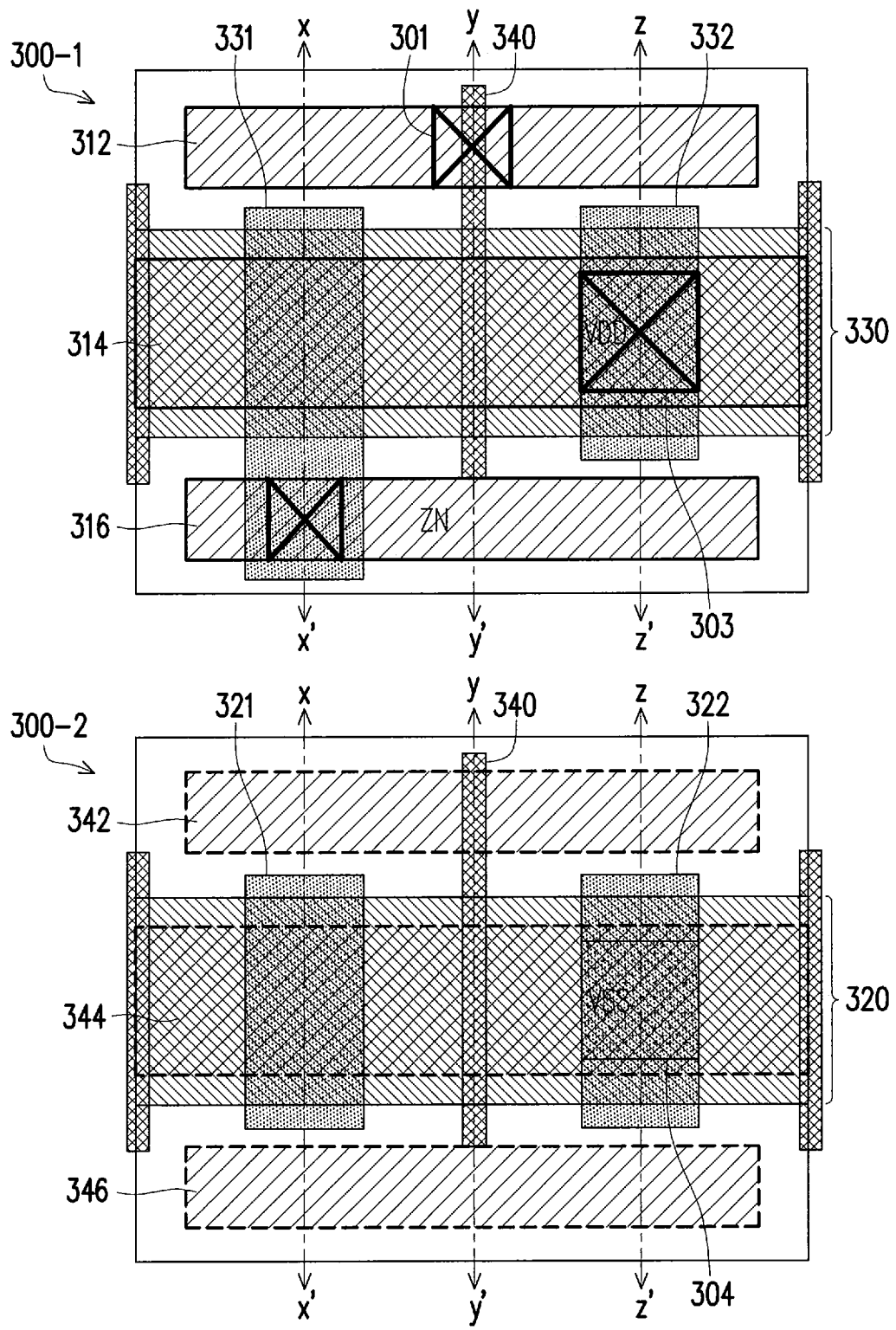
FIG. 3A illustrates top views of a front side and a back side of an exemplary inverter, in accordance with some embodiments of the present teaching.

An integrated circuit may comprise a plurality of cell structures. Each of the cell structures may be selected from standard cells like logic gates of AND, OR, NAND, NOT, NOR, etc. FIG. 3A illustrates top views of a front side and a back side of an exemplary standard cell, e.g. a NOT gate or an inverter, in accordance with some embodiments of the present teaching. As shown in FIG. 3A, the top view 300-1 of the front side of the inverter shows an active region 330 including the TMD layer 331, 332 and a gate structure 340, where metal lines 312, 314, 316 are formed above the action region 330; the top view 300-2 of the back side of the inverter shows an active region 320 including the BMD layer 321, 322 and the gate structure 340, where metal lines 342, 344, 346 are formed below the action region 320.

As shown in FIG. 3A, an input pin (I) 301 of the inverter 300-1 is routed from the gate structure 340 via the metal line 312 at the front side of the inverter 300-1; an output pin (ZN) 302 of the inverter 300-1 is routed from the TMD layer 331 via the metal line 316 at the front side of the inverter 300-1. In addition, a positive power supply (VDD) 303 is provided to the inverter 300-1 via the metal line 314 at the front side of the inverter 300-1; and a negative power supply (VSS) 304 is provided to the inverter 300-2 via the metal line 344 at the back side of the inverter 300-2.

Figure 3B:
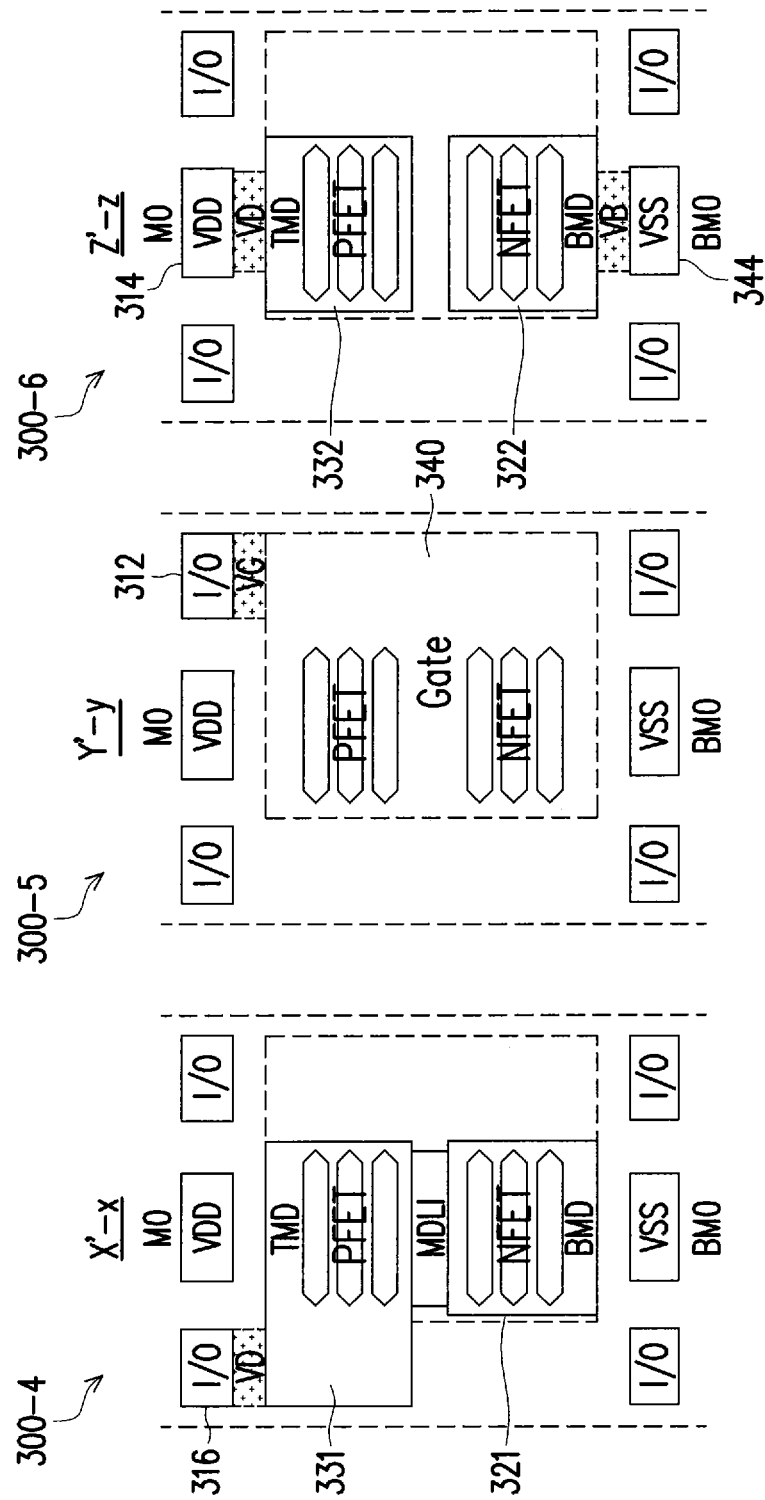
FIG. 3B illustrates cross sectional views of an exemplary inverter, in accordance with some embodiments of the present teaching.

FIG. 3B illustrates cross sectional views of the exemplary inverter 300-1, 300-2 in FIG. 3A, in accordance with some embodiments of the present teaching. The cross sectional views 300-4, 300-5, 300-6 in FIG. 3B correspond to cross sections along the lines X'-X, Y'-Y, Z'-Z in FIG. 3A respectively. As shown in FIG. 3B, the inverter 300-4 viewed crossing the PFET 331 and the NFET 321 along the line X'-X, has a via VD connecting the I/O metal line 316 and the PFET 331 to serve as an output (ZN) of the inverter at the front side; the inverter 300-5 viewed crossing the gate 340 along the line Y'-Y, has a via VG connecting the I/O metal line 312 and the gate 340 to serve as an input (I) of the inverter at the front side. In addition, the inverter 300-6 viewed crossing the PFET 332 and the NFET 322 along the line Z'-Z, has a via VD connecting the I/O metal line 314 and the PFET 332 to provide VDD power to the inverter at the front side, and has a via VB connecting the I/O metal line 344 and the NFET 322 to provide VSS power to the inverter at the back side.

Figure 4A:
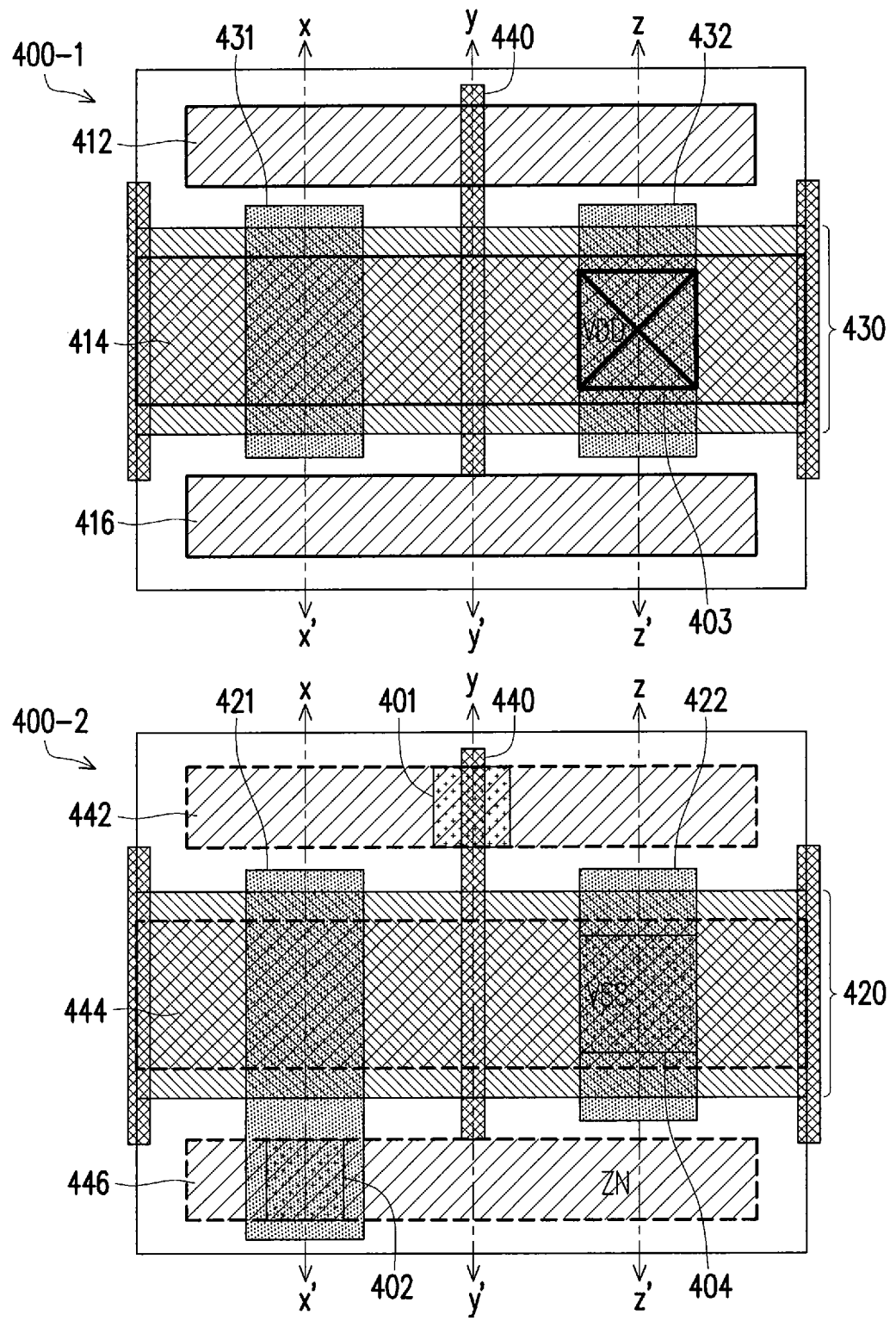
FIG. 4A illustrates top views of a front side and a back side of another exemplary inverter, in accordance with some embodiments of the present teaching.

FIG. 4A illustrates top views of a front side and a back side of another inverter, in accordance with some embodiments of the present teaching. As shown in FIG. 4A, the top view 400-1 of the front side of the inverter shows an active region 430 including the TMD layer 431, 432 and a gate structure 440, where metal lines 412, 414, 416 are formed above the action region 430; the top view 400-2 of the back side of the inverter shows an active region 420 including the BMD layer 421, 422 and the gate structure 440, where metal lines 442, 444, 446 are formed below the action region 420. As shown in FIG. 4A, an input pin (I) 401 of the inverter 400-2 is routed from the gate structure 440 via the metal line 442 at the back side of the inverter 400-2; an output pin (ZN) 402 of the inverter 400-2 is routed from the BMD layer 421 via the metal line 446 at the back side of the inverter 400-2. In addition, a positive power supply (VDD) 403 is provided to the inverter 400-1 via the metal line 414 at the front side of the inverter 400-1; and a negative power supply (VSS) 404 is provided to the inverter 400-2 via the metal line 444 at the back side of the inverter 400-2.

Figure 4B:
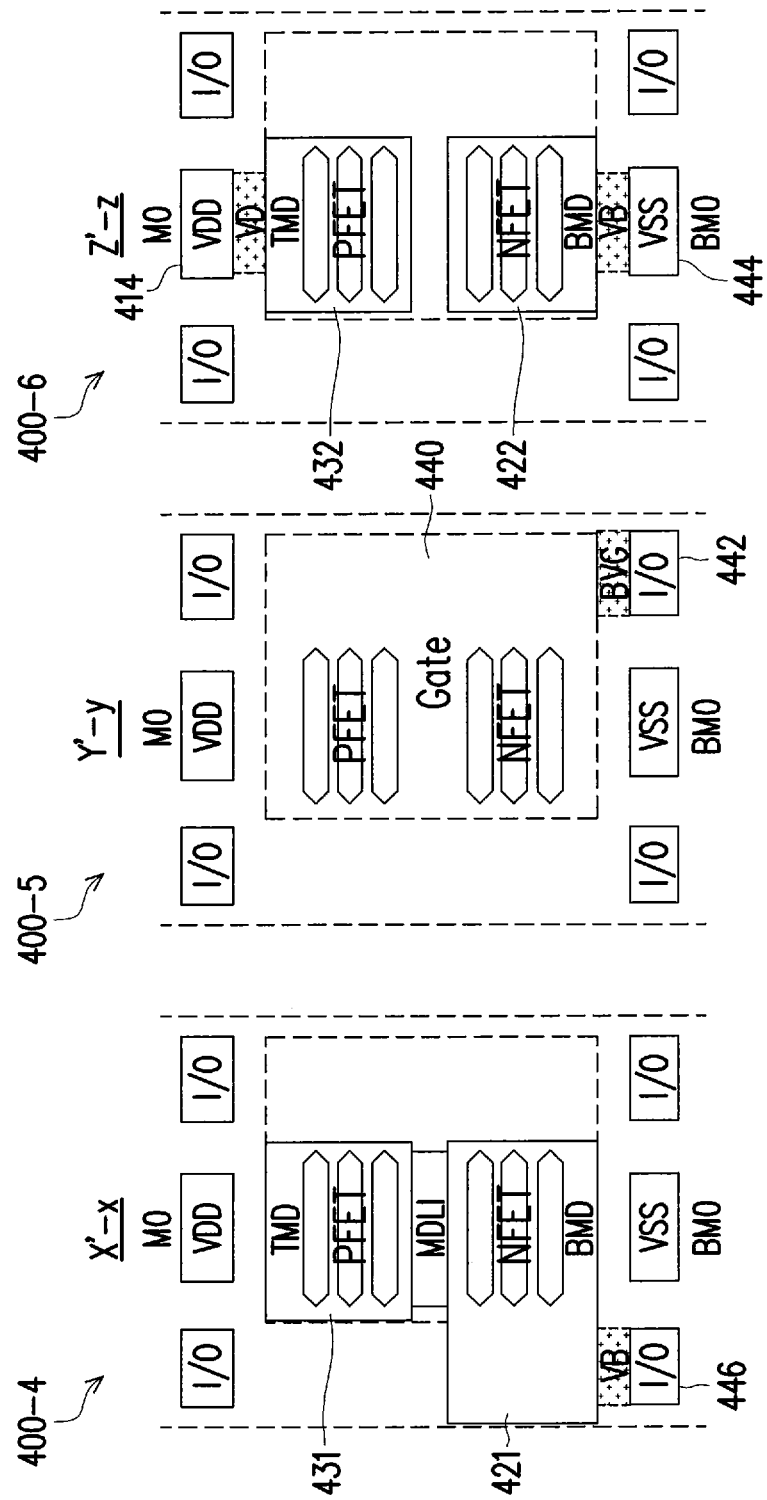
FIG. 4B illustrates cross sectional views of another exemplary inverter, in accordance with some embodiments of the present teaching.

FIG. 4B illustrates cross sectional views of the exemplary inverter 400-1, 400-2 in FIG. 4A, in accordance with some embodiments of the present teaching. The cross sectional views 400-4, 400-5, 400-6 in FIG. 4B correspond to cross sections along the lines X'-X, Y'-Y, Z'-Z in FIG. 4A respectively. As shown in FIG. 4B, the inverter 400-4 viewed crossing the PFET 431 and the NFET 421 along the line X'-X, has a via VB connecting the I/O metal line 446 and the NFET 421 to serve as an output (ZN) of the inverter at the back side; the inverter 400-5 viewed crossing the gate 440 along the line Y'-Y, has a via BVG connecting the I/O metal line 442 and the gate 440 to serve as an input (I) of the inverter at the back side. In addition, the inverter 400-6 viewed crossing the PFET 432 and the NFET 422 along the line Z'-Z, has a via VD connecting the I/O metal line 414 and the PFET 432 to provide VDD power to the inverter at the front side, and has a via VB connecting the I/O metal line 444 and the NFET 422 to provide VSS power to the inverter at the back side.

Figure 5A:
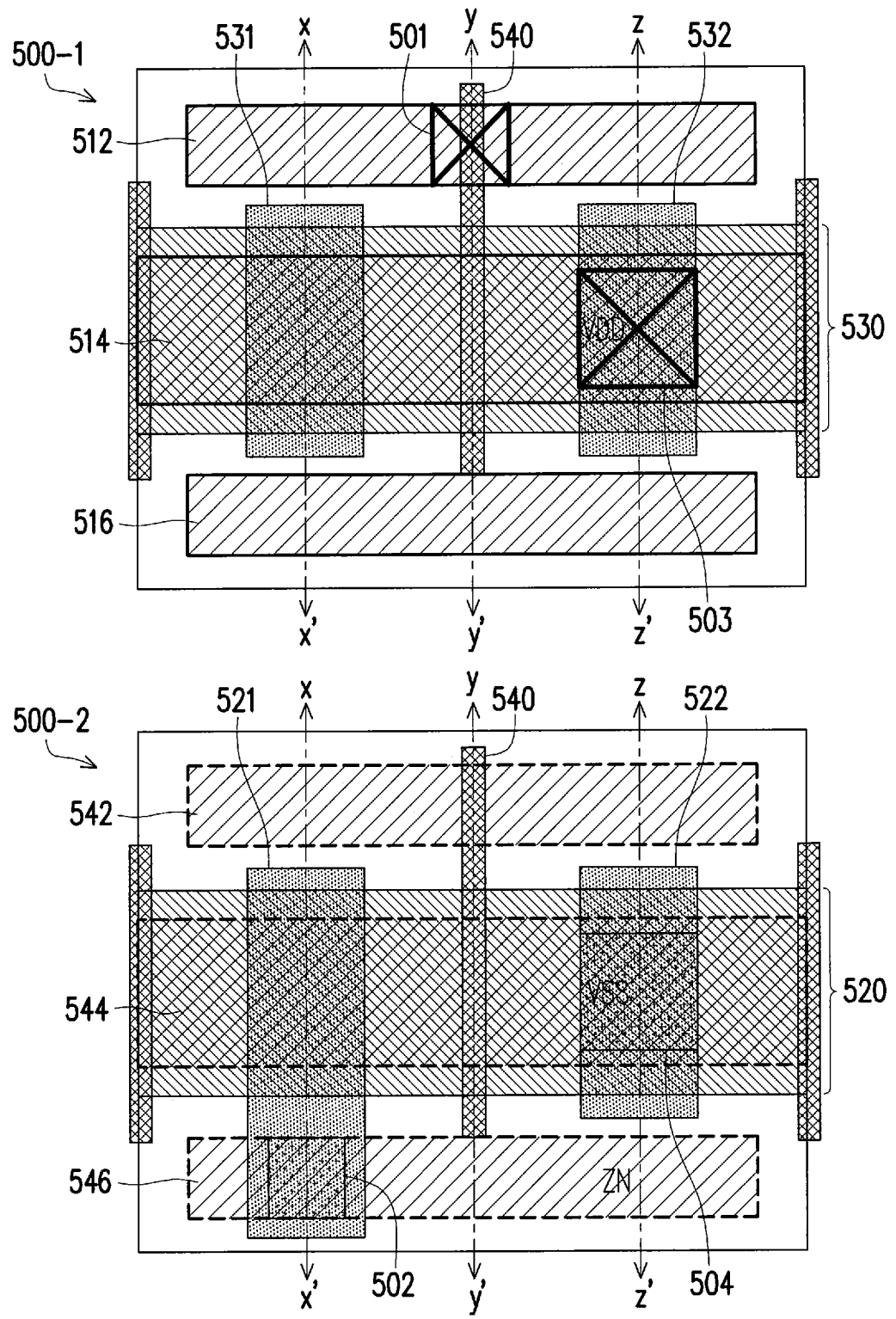
FIG. 5A illustrates top views of a front side and a back side of yet another exemplary inverter, in accordance with some embodiments of the present teaching.

FIG. 5A illustrates top views of a front side and a back side of yet another inverter, in accordance with some embodiments of the present teaching. As shown in FIG. 5A, the top view 500-1 of the front side of the inverter shows an active region 530 including the TMD layer 531, 532 and a gate structure 540, where metal lines 512, 514, 516 are formed above the action region 530; the top view 500-2 of the back side of the inverter shows an active region 520 including the BMD layer 521, 522 and the gate structure 540, where metal lines 542, 544, 546 are formed below the action region 520. As shown in FIG. 5A, an input pin (I) 501 of the inverter 500-1 is routed from the gate structure 540 via the metal line 512 at the front side of the inverter 500-1; an output pin (ZN) 502 of the inverter 500-2 is routed from the BMD layer 521 via the metal line 546 at the back side of the inverter 500-2. In addition, a positive power supply (VDD) 503 is provided to the inverter 500-1 via the metal line 514 at the front side of the inverter 500-1; and a negative power supply (VSS) 504 is provided to the inverter 500-2 via the metal line 544 at the back side of the inverter 500-2.

Figure 5B:
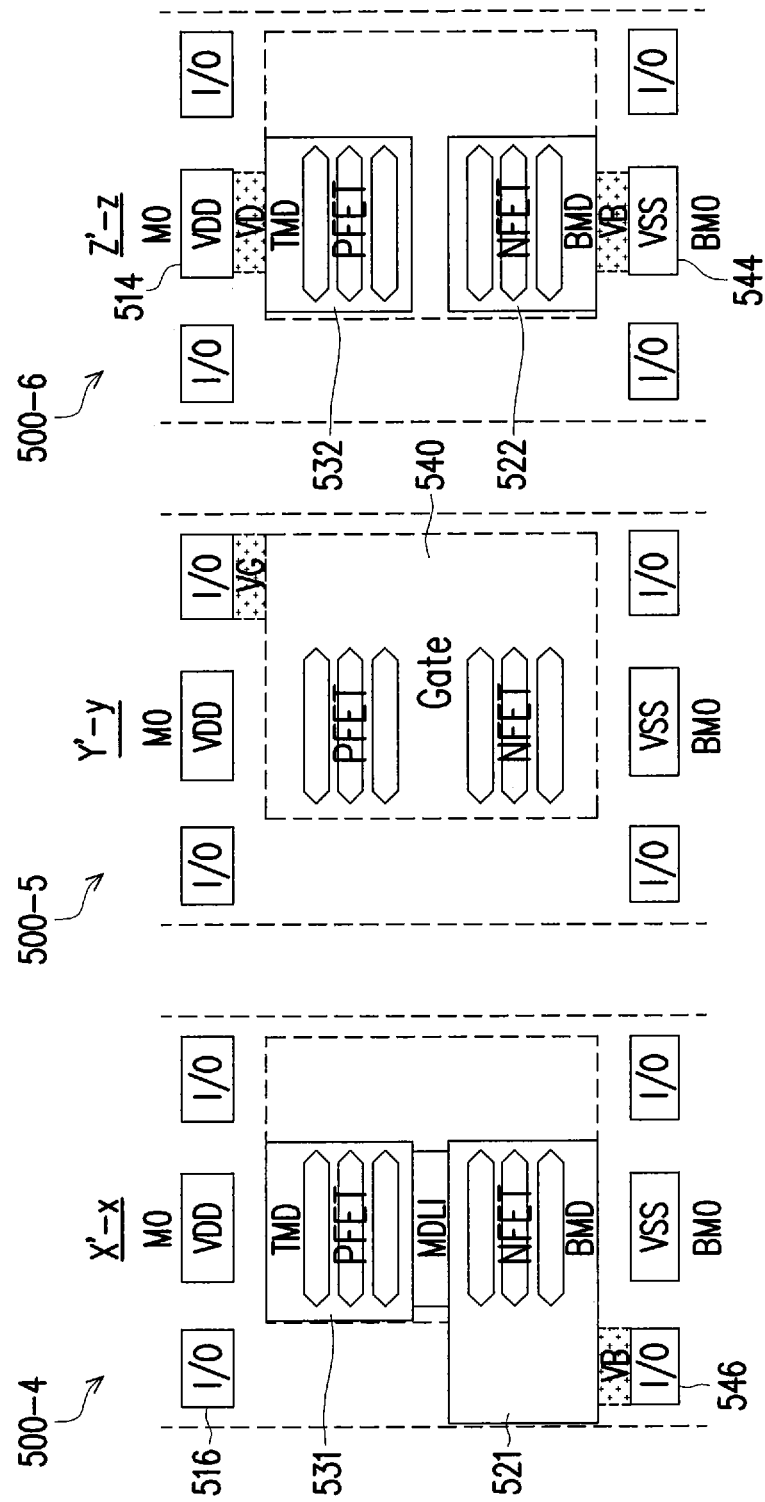
FIG. 5B illustrates cross sectional views of yet another exemplary inverter, in accordance with some embodiments of the present teaching.

FIG. 5B illustrates cross sectional views of the exemplary inverter 500-1, 500-2 in FIG. 5A, in accordance with some embodiments of the present teaching. The cross sectional views 500-4, 500-5, 500-6 in FIG. 5B correspond to cross sections along the lines X'-X, Y'-Y, Z'-Z in FIG. 5A respectively. As shown in FIG. 5B, the inverter 500-4 viewed crossing the PFET 531 and the NFET 521 along the line X'-X, has a via VB connecting the I/O metal line 546 and the NFET 521 to serve as an output (ZN) of the inverter at the back side; the inverter 500-5 viewed crossing the gate 540 along the line Y'-Y, has a via VG connecting the I/O metal line 512 and the gate 540 to serve as an input (I) of the inverter at the front side. In addition, the inverter 500-6 viewed crossing the PFET 532 and the NFET 522 along the line Z'-Z, has a via VD connecting the I/O metal line 514 and the PFET 532 to provide VDD power to the inverter at the front side, and has a via VB connecting the I/O metal line 544 and the NFET 522 to provide VSS power to the inverter at the back side.

Figure 6A:
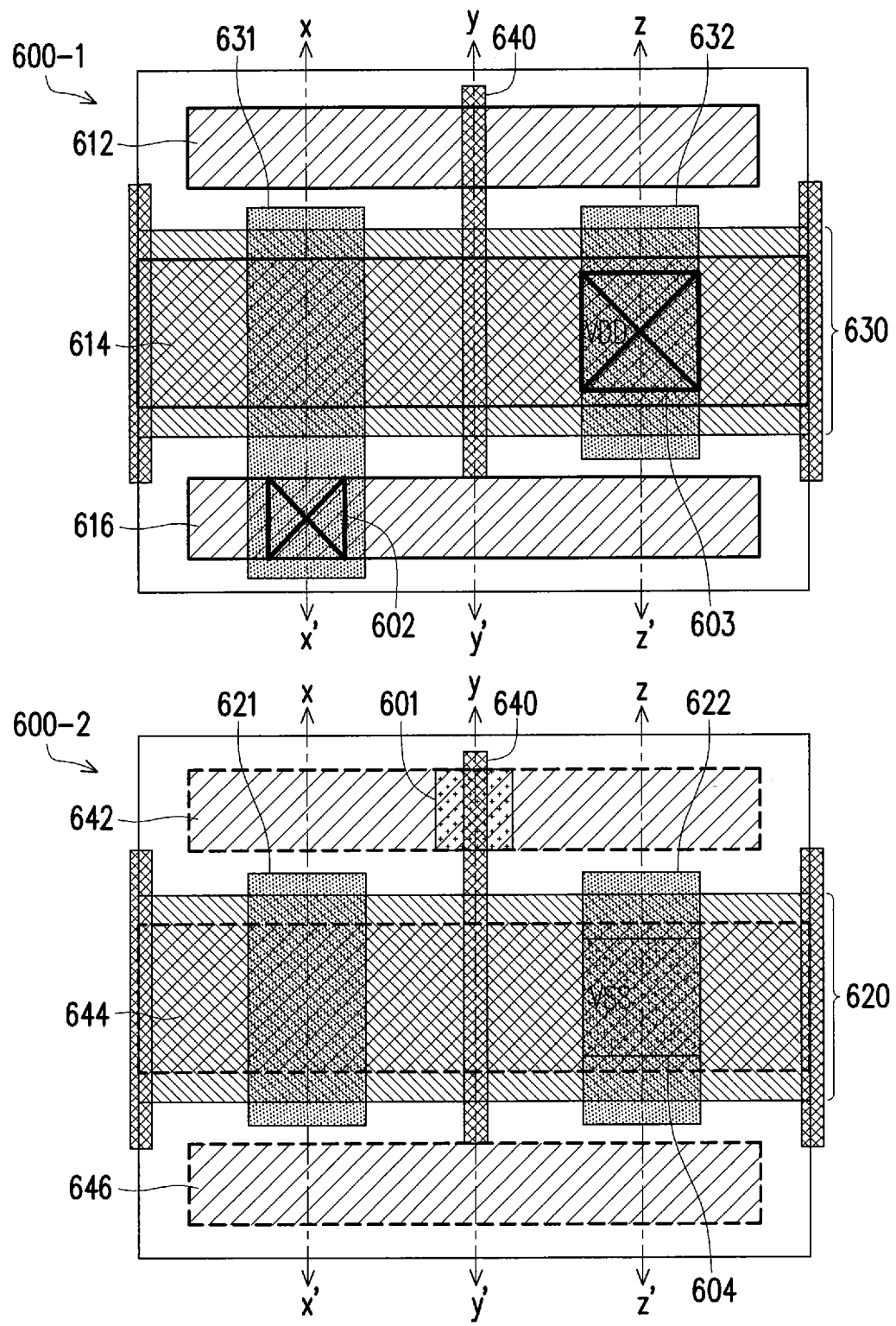
FIG. 6A illustrates top views of a front side and a back side of still another exemplary inverter, in accordance with some embodiments of the present teaching.

FIG. 6A illustrates top views of a front side and a back side of another inverter, in accordance with some embodiments of the present teaching. As shown in FIG. 6A, the top view 600-1 of the front side of the inverter shows an active region 630 including the TMD layer 631, 632 and a gate structure 640, where metal lines 612, 614, 616 are formed above the action region 630; the top view 600-2 of the back side of the inverter shows an active region 620 including the BMD layer 621, 622 and the gate structure 640, where metal lines 642, 644, 646 are formed below the action region 620. As shown in FIG. 6A, an input pin (I) 601 of the inverter 600-2 is routed from the gate structure 640 via the metal line 642 at the back side of the inverter 600-2; an output pin (ZN) 602 of the inverter 600-1 is routed from the TMD layer 631 via the metal line 616 at the front side of the inverter 600-1. In addition, a positive power supply (VDD) 603 is provided to the inverter 600-1 via the metal line 614 at the front side of the inverter 600-1; and a negative power supply (VSS) 604 is provided to the inverter 600-2 via the metal line 644 at the back side of the inverter 600-2.

Figure 6B:
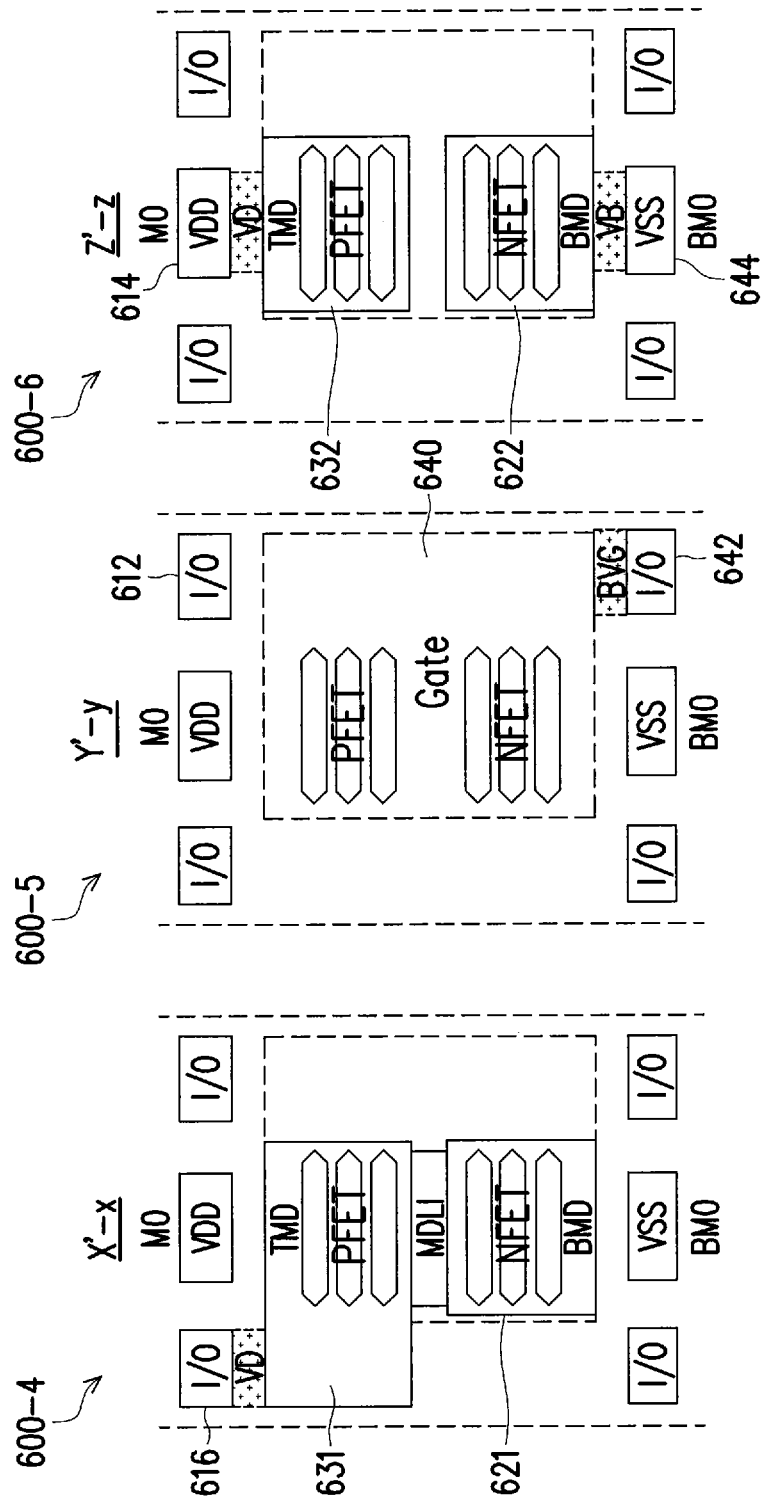
FIG. 6B illustrates cross sectional views of still another exemplary inverter, in accordance with some embodiments of the present teaching.

FIG. 6B illustrates cross sectional views of the exemplary inverter 600-1, 600-2 in FIG. 6A, in accordance with some embodiments of the present teaching. The cross sectional views 600-4, 600-5, 600-6 in FIG. 6B correspond to cross sections along the lines X'-X, Y'-Y, Z'-Z in FIG. 6A respectively. As shown in FIG. 6B, the inverter 600-4 viewed crossing the PFET 631 and the NFET 621 along the line X'-X, has a via VD connecting the I/O metal line 616 and the PFET 631 to serve as an output (ZN) of the inverter at the front side; the inverter 600-5 viewed crossing the gate 640 along the line Y'-Y, has a via BVG connecting the I/O metal line 642 and the gate 640 to serve as an input (I) of the inverter at the back side. In addition, the inverter 600-6 viewed crossing the PFET 632 and the NFET 622 along the line Z'-Z, has a via VD connecting the I/O metal line 614 and the PFET 632 to provide VDD power to the inverter at the front side, and has a via VB connecting the I/O metal line 644 and the NFET 622 to provide VSS power to the inverter at the back side.

As shown in FIGS. 3-6, when a standard cell is an inverter with two input/output (I/O) pins, one of the two I/O pins can be routed from the back side of the standard cell, while the other one of the two I/O pins can be routed from the front side of the standard cell. In some embodiments, the positions of the PFET and the NFET shown in any inverter in FIGS. 3-6 can be exchanged without going beyond the scope of the present teaching.

Figure 7A:
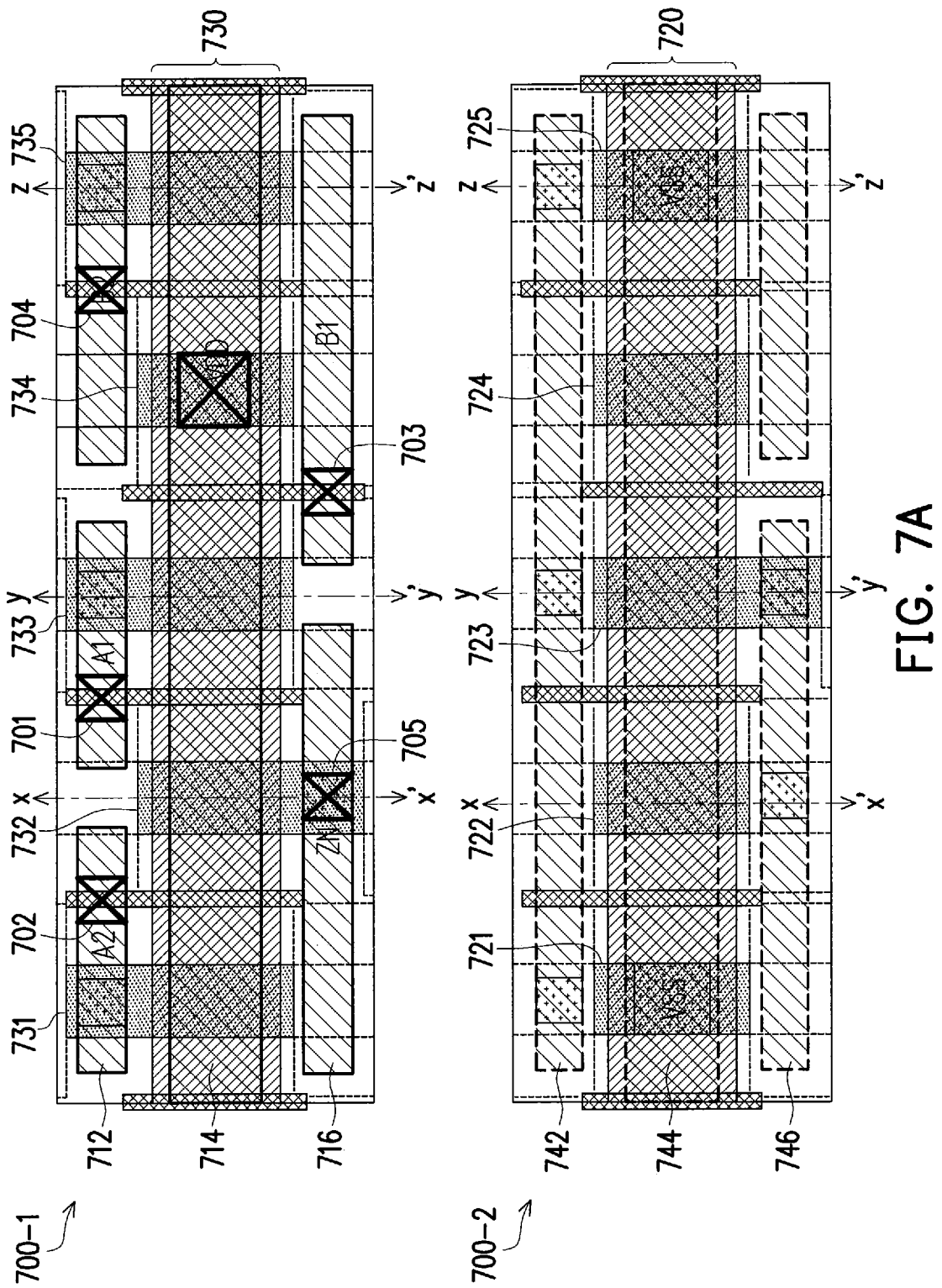
FIG. 7A illustrates top views of a front side and a back side of a first exemplary 3D device, in accordance with some embodiments of the present teaching.

FIG. 7A illustrates top views of a front side and a back side of a first exemplary 3D device, in accordance with some embodiments of the present teaching. As shown in FIG. 7A, the top view 700-1 of the front side of the device shows an active region 730 including the TMD layer 731, 732, 733, 734, 735 with some gate structures, where metal lines 712, 714, 716 are formed above the action region 730; the top view 700-2 of the back side of the device shows an active region 720 including the BMD layer 721, 722, 723, 724, 725 with some gate structures, where metal lines 742, 744, 746 are formed below the action region 720. The first exemplary 3D device in FIG. 7A has five I/O pins: A1 701, A2 702, B1 703, B2 704 and ZN 705. As shown in FIG. 7A, each of the five I/O pins is routed via a metal line at the front side of device. In addition, a positive power supply (VDD) is provided to the device 700-1 via the metal line 714 at the front side of the device 700-1; and a negative power supply (VSS) is provided to the device 700-2 via the metal line 744 at the back side of the device 700-2.

Figure 7B:
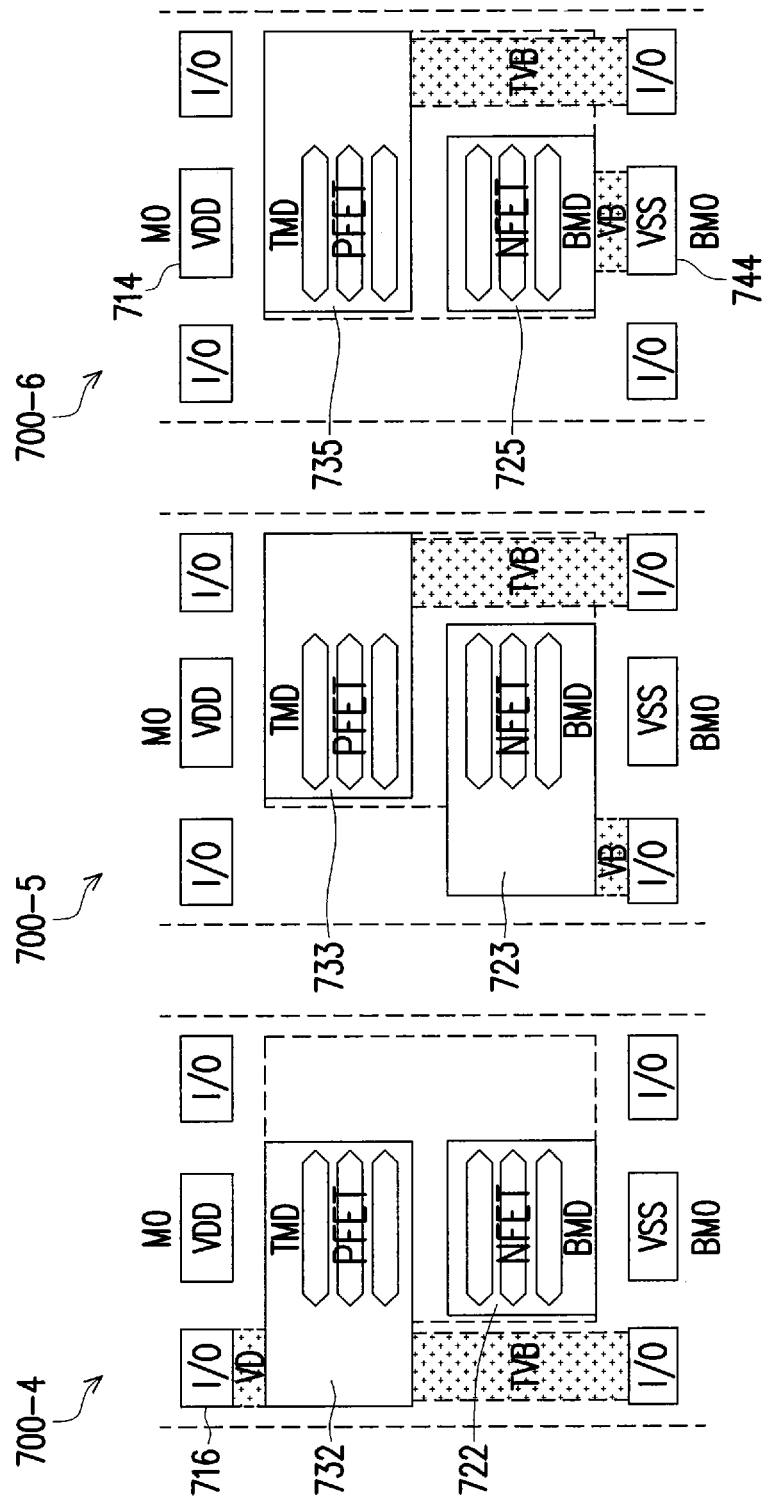
FIG. 7B illustrates cross sectional views of the first exemplary 3D device, in accordance with some embodiments of the present teaching.

FIG. 7B illustrates cross sectional views of the exemplary device 700-1, 700-2 in FIG. 7A, in accordance with some embodiments of the present teaching. The cross sectional views 700-4, 700-5, 700-6 in FIG. 7B correspond to cross sections along the lines X'-X, Y'-Y, Z'-Z in FIG. 7A respectively. As shown in FIG. 7B, the device 700-4 viewed crossing the PFET 732 and the NFET 722 along the line X'-X, has a via VD connecting the I/O metal line 716 and the PFET 732 to serve as an output (ZN) of the device at the front side; the device 700-5 viewed crossing the PFET 733 and the NFET 723 along the line Y'-Y, has a via VB connecting the I/O metal line at the back side and the NFET 723. In addition, the device 700-6 viewed crossing the PFET 735 and the NFET 725 along the line Z'-Z, has a via VB connecting the I/O metal line 744 and the NFET 725 to provide VSS power to the device at the back side.

Figure 8:
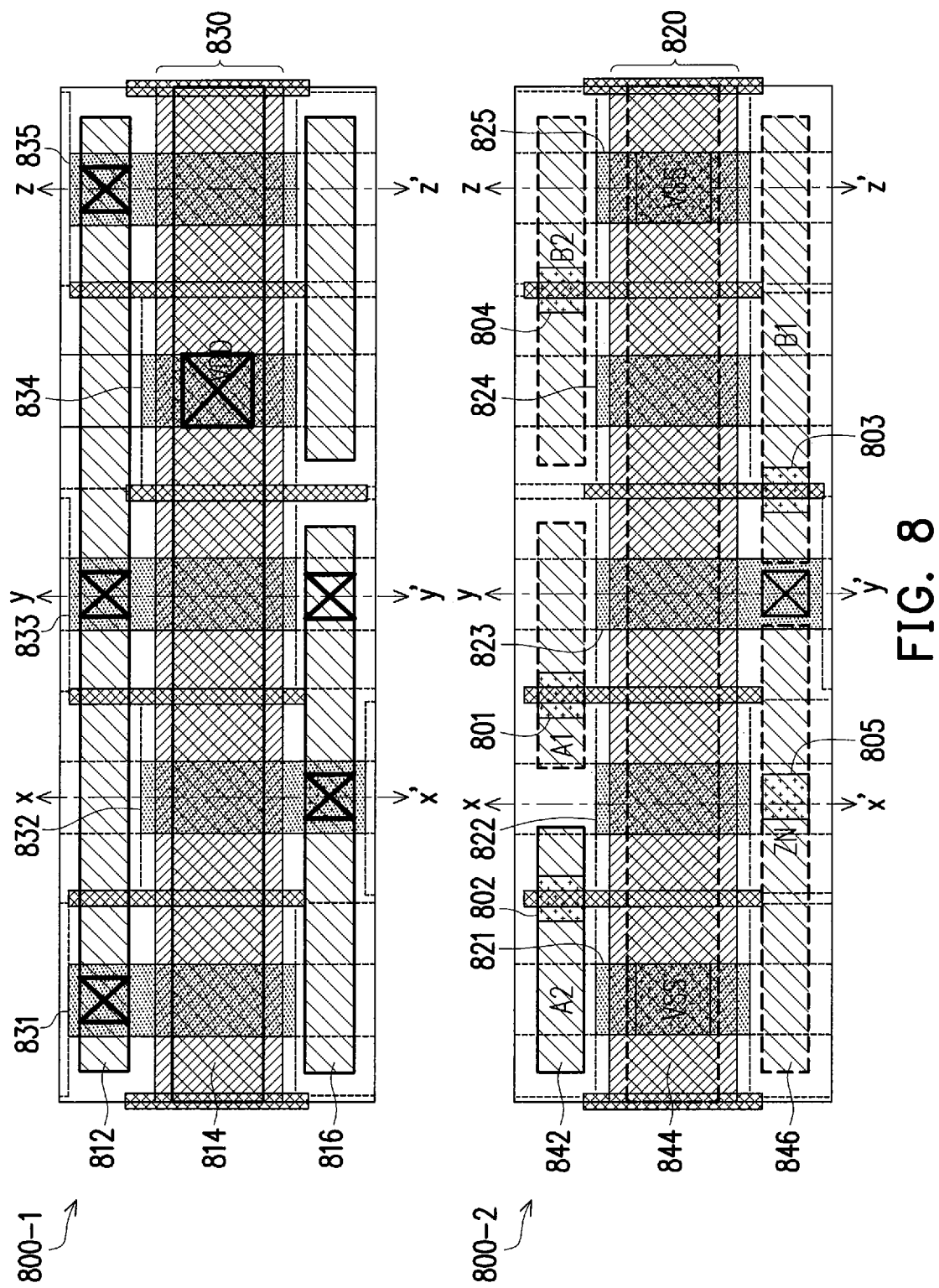
FIG. 8 illustrates top views of a front side and a back side of a second exemplary 3D device, in accordance with some embodiments of the present teaching.

FIG. 8 illustrates top views of a front side and a back side of a second exemplary 3D device, in accordance with some embodiments of the present teaching. As shown in FIG. 8, the top view 800-1 of the front side of the device shows an active region 830 including the TMD layer 831, 832, 833, 834, 835 with some gate structures, where metal lines 812, 814, 816 are formed above the action region 830; the top view 800-2 of the back side of the device shows an active region 820 including the BMD layer 821, 822, 823, 824, 825 with some gate structures, where metal lines 842, 844, 846 are formed below the action region 820. The second exemplary 3D device in FIG. 8 has five I/O pins: A1 801, A2 802, B1 803, B2 804 and ZN 805. As shown in FIG. 8, each of the five I/O pins is routed via a metal line at the back side of device.

Figure 9:
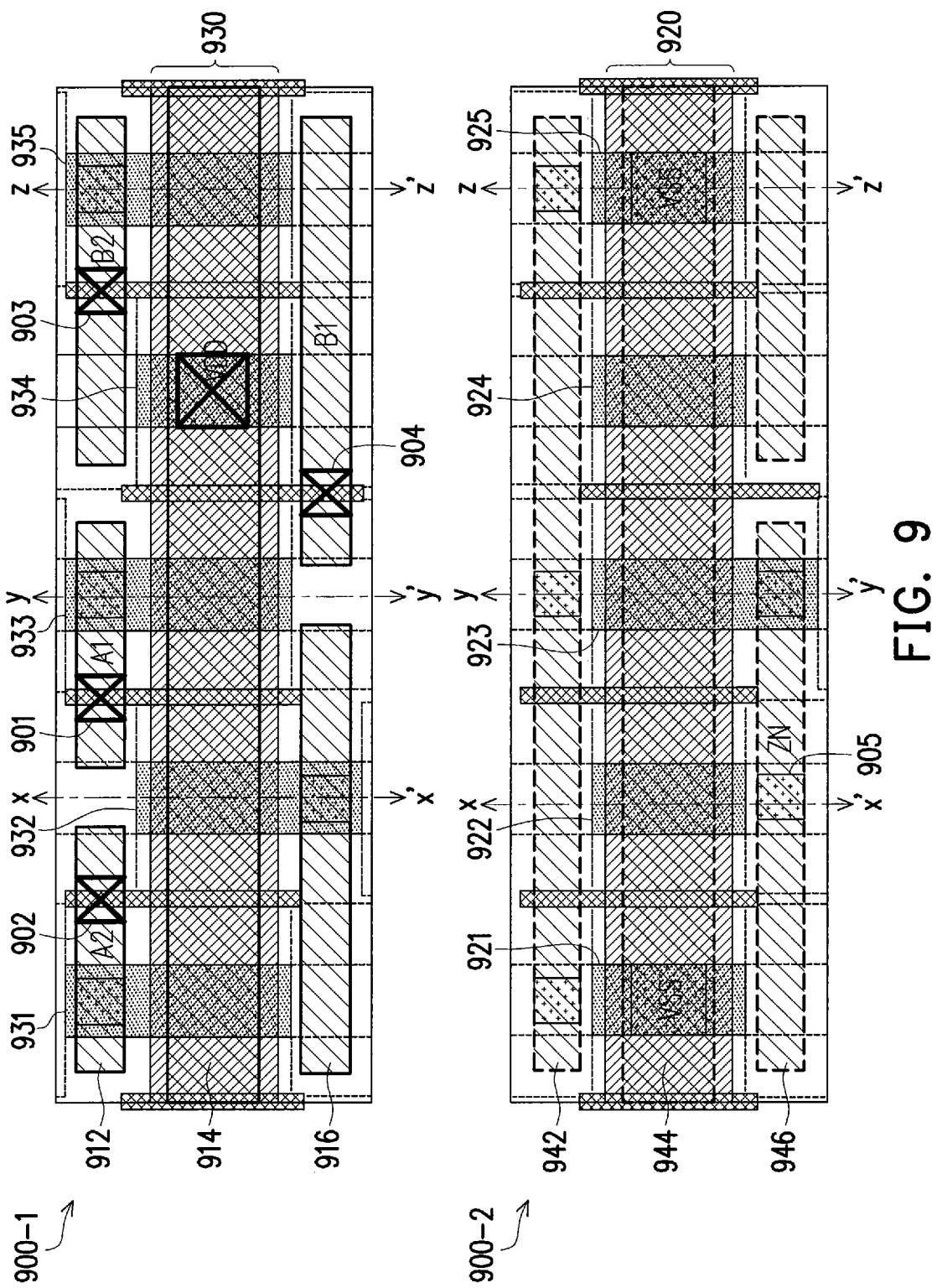
FIG. 9 illustrates top views of a front side and a back side of a third exemplary 3D device, in accordance with some embodiments of the present teaching.

FIG. 9 illustrates top views of a front side and a back side of a third exemplary 3D device, in accordance with some embodiments of the present teaching. As shown in FIG. 9, the top view 900-1 of the front side of the device shows an active region 930 including the TMD layer 931, 932, 933, 934, 935 with some gate structures, where metal lines 912, 914, 916 are formed above the action region 930; the top view 900-2 of the back side of the device shows an active region 920 including the BMD layer 921, 922, 923, 924, 925 with some gate structures, where metal lines 942, 944, 946 are formed below the action region 920. The third exemplary 3D device in FIG. 9 has five I/O pins: A1 901, A2 902, B1 903, B2 904 and ZN 905. As shown in FIG. 9, the four I/O pins A1 901, A2 902, B1 903, B2 904 are routed via a metal line at the front side of device; while the I/O pin ZN 905 is routed via a metal line at the back side of the device.

Figure 10:
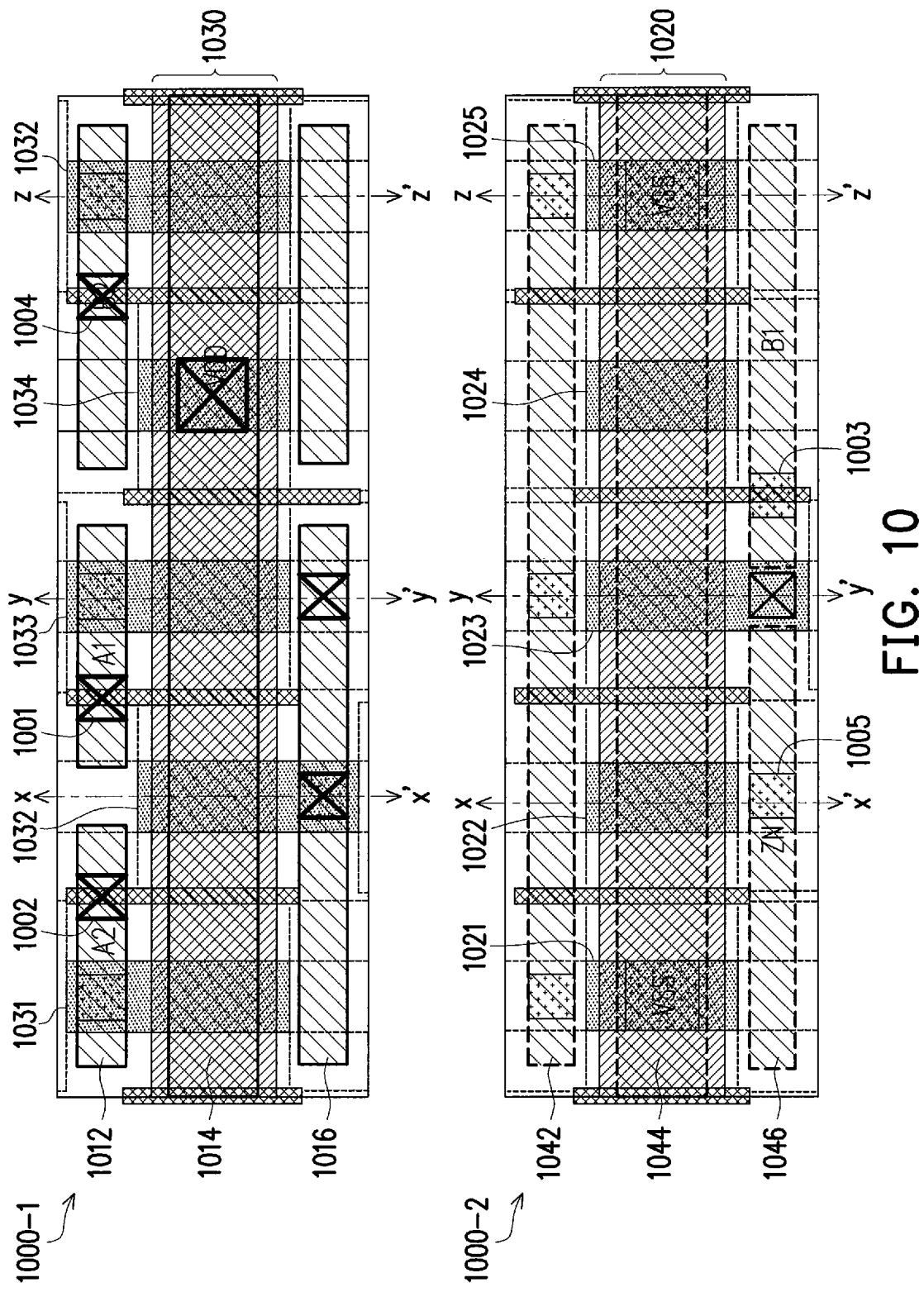
FIG. 10 illustrates top views of a front side and a back side of a fourth exemplary 3D device, in accordance with some embodiments of the present teaching.

FIG. 10 illustrates top views of a front side and a back side of a fourth exemplary 3D device, in accordance with some embodiments of the present teaching. As shown in FIG. 10, the top view 1000-1 of the front side of the device shows an active region 1030 including the TMD layer 1031, 1032, 1033, 1034, 1035 with some gate structures, where metal lines 1012, 1014, 1016 are formed above the action region 1030; the top view 1000-2 of the back side of the device shows an active region 1020 including the BMD layer 1021, 1022, 1023, 1024, 1025 with some gate structures, where metal lines 1042, 1044, 1046 are formed below the action region 1020. The fourth exemplary 3D device in FIG. 10 has five I/O pins: A1 1001, A2 1002, B1 1003, B2 1004 and ZN 1005. As shown in FIG. 10, the three I/O pins A1 1001, A2 1002, B2 1004 are routed via a metal line at the front side of device; while the two I/O pins B1 1003 and ZN 1005 are routed via a metal line at the back side of the device.

Figure 11:
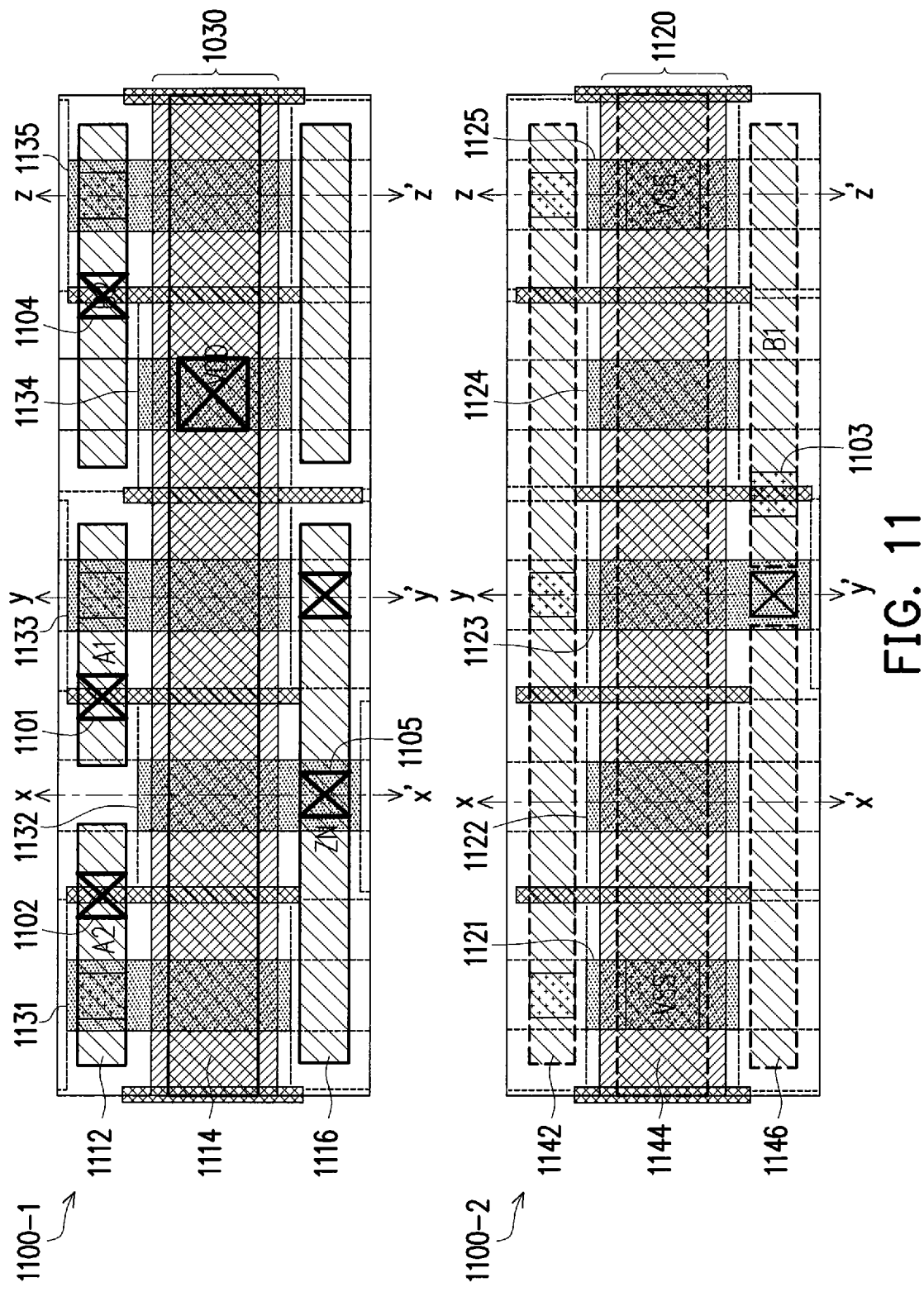
FIG. 11 illustrates top views of a front side and a back side of a fifth exemplary 3D device, in accordance with some embodiments of the present teaching.

FIG. 11 illustrates top views of a front side and a back side of a fifth exemplary 3D device, in accordance with some embodiments of the present teaching. As shown in FIG. 11, the top view 1100-1 of the front side of the device shows an active region 1130 including the TMD layer 1131, 1132, 1133, 1134, 1135 with some gate structures, where metal lines 1112, 1114, 1116 are formed above the action region 1130; the top view 1100-2 of the back side of the device shows an active region 1120 including the BMD layer 1121, 1122, 1123, 1124, 1125 with some gate structures, where metal lines 1142, 1144, 1146 are formed below the action region 1120. The fifth exemplary 3D device in FIG. 11 has five I/O pins: A1 1101, A2 1102, B1 1103, B2 1104 and ZN 1105. As shown in FIG. 11, the four I/O pins A1 1101, A2 1102, B2 1104 and ZN 1105 are routed via a metal line at the front side of device; while the I/O pin B1 1103 is routed via a metal line at the back side of the device.

In other embodiments, a standard cell having a similar structure to that of the devices shown in FIGS. 7-11 can have different combinations of routings for the five I/O pins. Since each of the five I/O pins can be routed from the front side or the back side of the device, there are in total 32 scenarios of the I/O pin routing combinations. In some embodiments, at least one of the five I/O pins is routed from the back side of the standard cell; and at least one of the five I/O pins is routed from the front side of the standard cell. In some embodiments, the positions of the PFET and the NFET shown in any device in FIGS. 7-11 can be exchanged without going beyond the scope of the present teaching. In some embodiments, for a standard cell having a plurality of I/O pins, at least one of the plurality of I/O pins is routed from both the back side and the front side of the standard cell.

Figure 12:
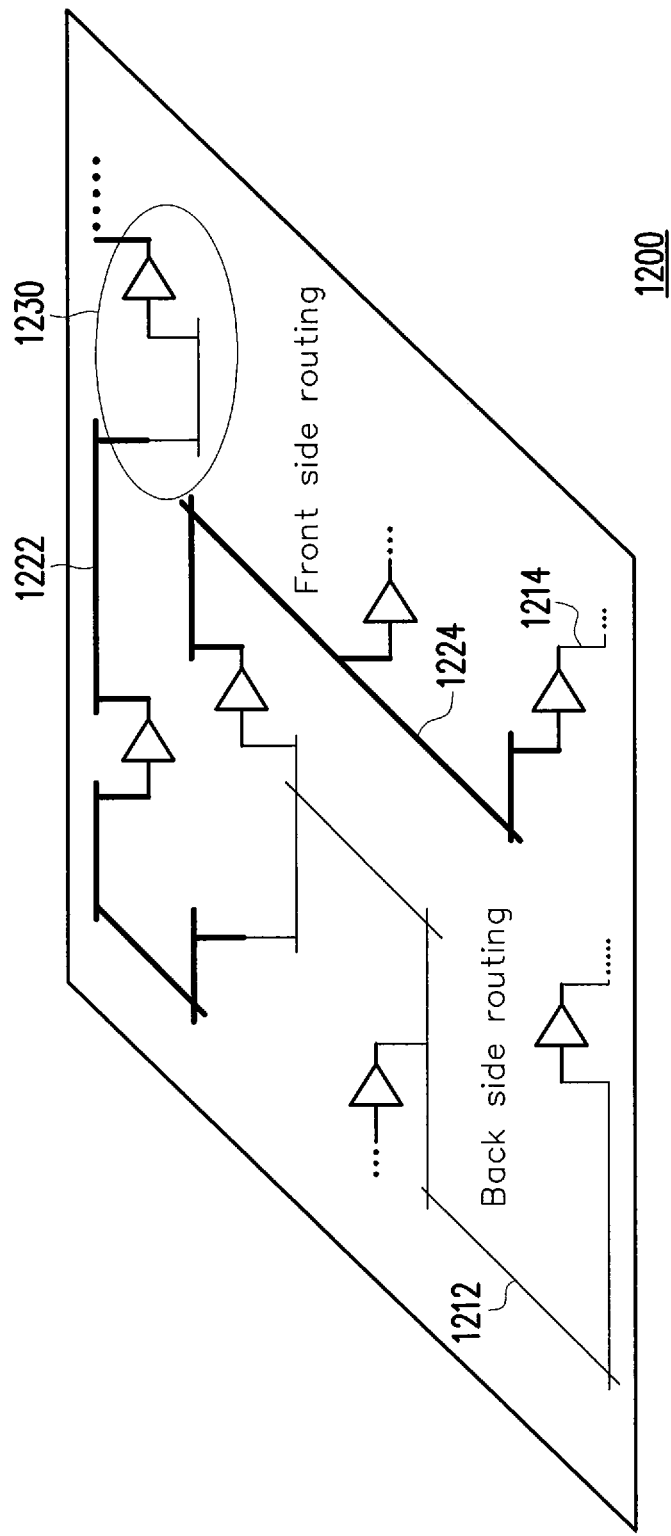
FIG. 12 illustrates a circuit device with a routing layout on both front side and back side of the circuit device, in accordance with some embodiments of the present teaching.

FIG. 12 illustrates a circuit device 1200 with a routing layout on both front side and back side of the circuit device 1200, in accordance with some embodiments of the present teaching. In some embodiments, the circuit device 1200 includes a plurality of standard cells, where each standard cell has I/O pins routed from either back side or front side of the circuit device 1200. As such, the circuit device 1200 has some back side routing portions 1212, 1214; and has some front side routing portions 1222, 1224. In some embodiments, the circuit device 1200 also includes a portion 1230, where the routing connection goes from front side to back side, and then goes from back side to front side before going through any active region.

Figure 13A:
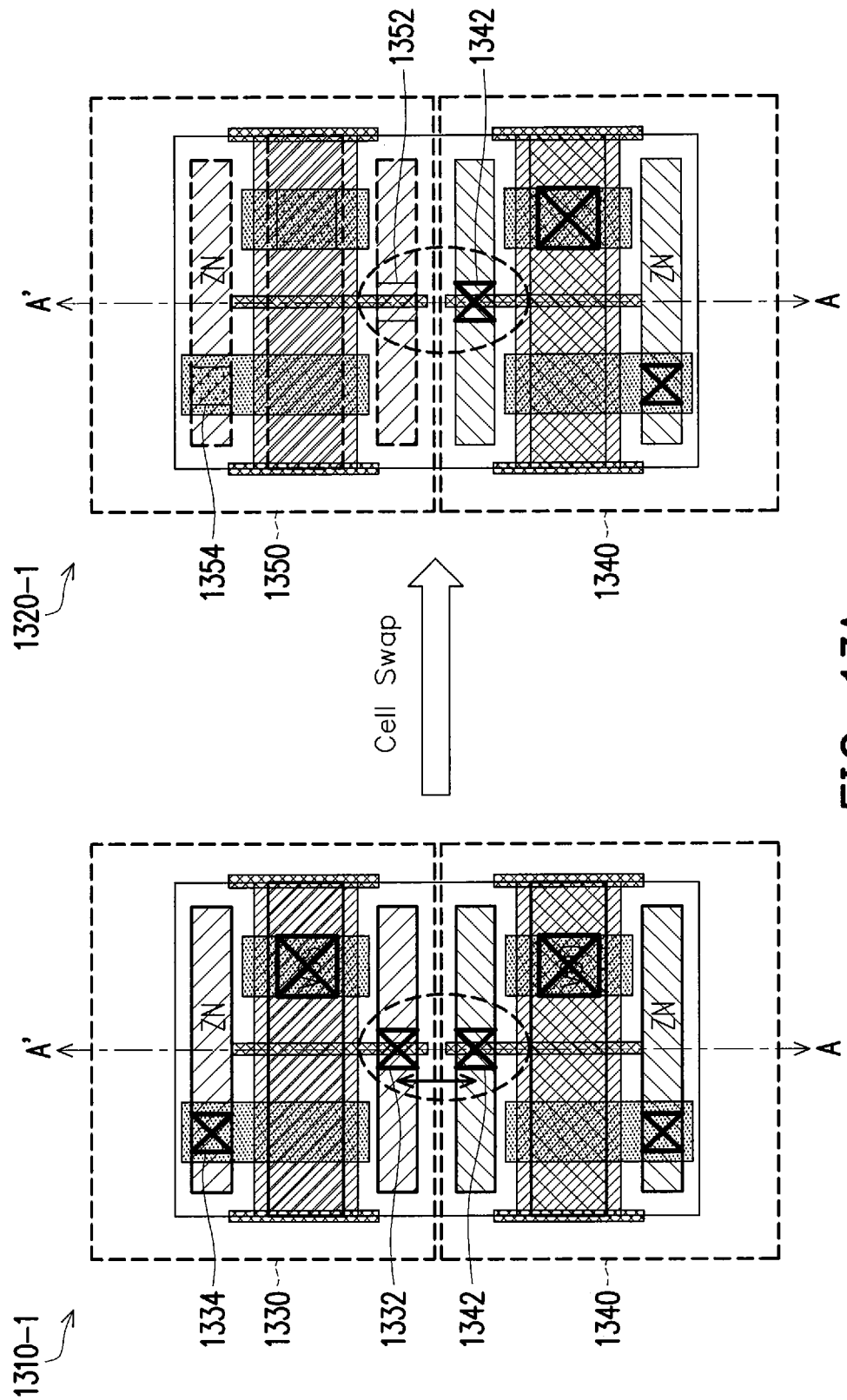
FIG. 13A illustrates a cell swap method based on top views of a circuit, in accordance with some embodiments of the present teaching.
Figure 13B:
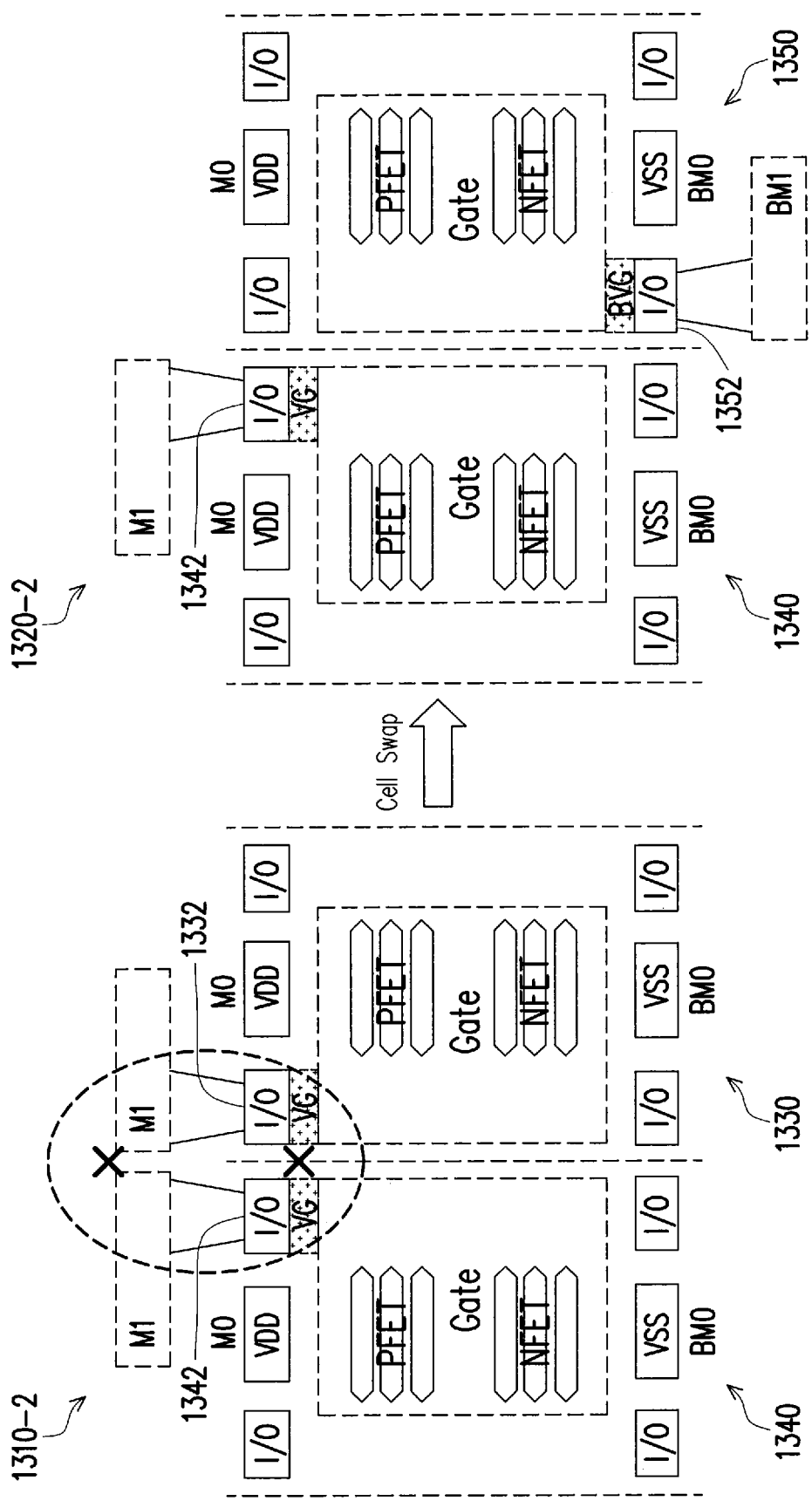
FIG. 13B illustrates a cell swap method based on cross sectional views of a circuit, in accordance with some embodiments of the present teaching.

FIG. 13A illustrates a cell swap method based on top views of a circuit, in accordance with some embodiments of the present teaching. As shown in FIG. 13A, the circuit 1320-1 can be generated by swapping a cell 1330 in the circuit 1310-1 to be the cell 1350 in the circuit 1320-1, 1, without changing the other cell 1340. FIG. 13B illustrates a cell swap method based on cross sectional views of the circuit in FIG. 13A, in accordance with some embodiments of the present teaching. The cross sectional views 1310-2, 1320-2 in FIG. 13B correspond to cross sections along the lines A-A' of the circuits 1310-1, 1320-1 in FIG. 13A, respectively.

As shown in FIG. 13A, the circuit 1310-1 before cell swap has two adjacent cells 1330, 1340 that have two I/O pins 1332, 1342 respectively. When the two I/O pins 1332, 1342 are too close to each other, a design rule may be violated to cause a pin access issue. For example, since the two I/O pins 1332, 1342 are routed both at the front side of the circuit 1310-1 before cell swap, a distance between the two I/O pins 1332, 1342 may be smaller than a predetermined threshold. In this case, the two VG vias of the two I/O pins 1332, 1342 may be too close to be separated or electrically isolated during fabrication, as shown in the cross sectional view 1310-2 in FIG. 13B. In addition, the two metal 1 (M1) lines above the two I/O pins 1332, 1342 may also be too close or too crowded to be formed thereon for pin access.

As such, a cell swap may be performed on any one of the two adjacent cells 1330, 1340. For example, as shown in FIG. 13A, the cell 1330 is swapped upside down to become the cell 1350, such that: the input pin 1332 is changed from a front side routing pin to a back side routing pin 1352, and the output pin 1334 is changed from a front side routing pin to a back side routing pin 1354. As shown in FIG. 13B, after the cell swap, the distance between the two vias of the two I/O pins 1352, 1342 of the two adjacent cells 1350, 1340 becomes much larger; and the distance between the metal 1 lines of the two I/O pins 1352, 1342 of the two adjacent cells 1350, 1340 becomes much larger, such that the design rule can be satisfied and the pin access issue can be avoided.

Figure 14:
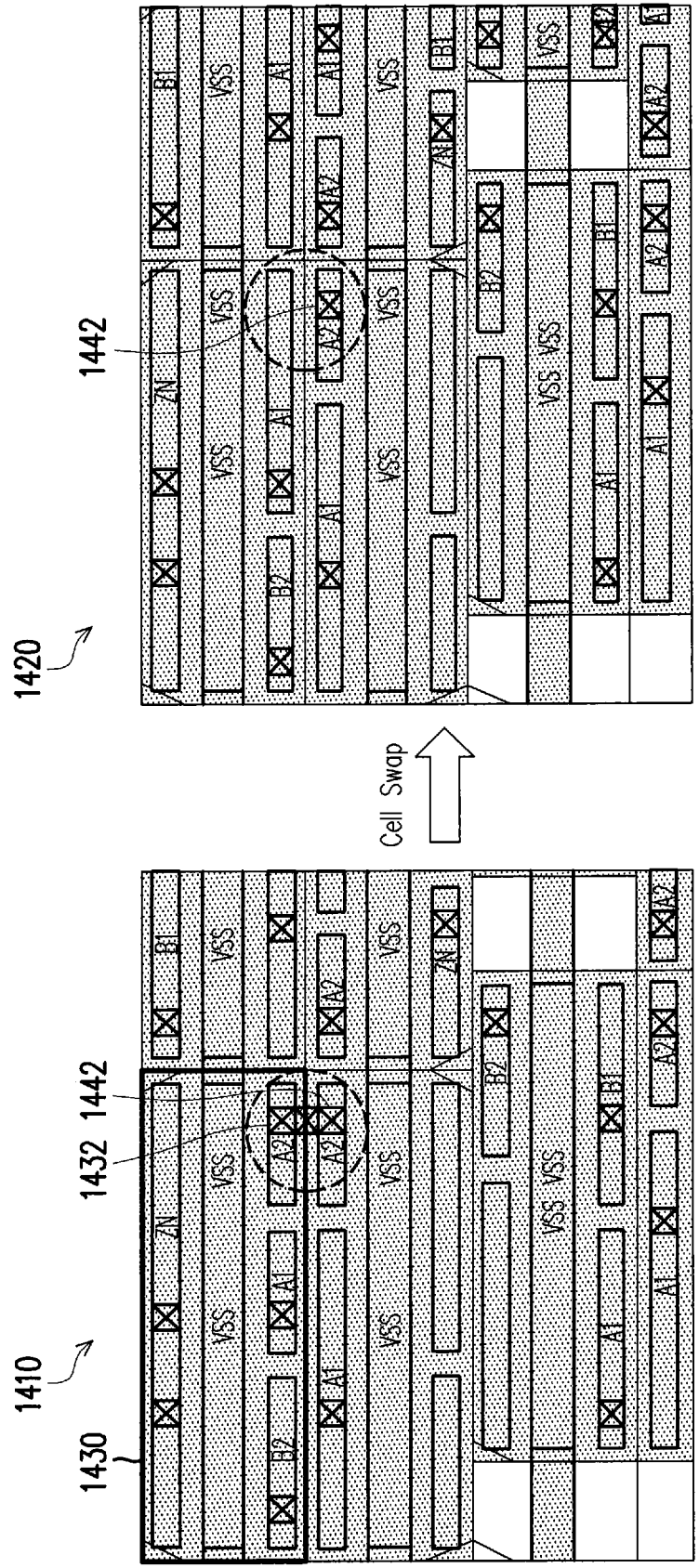
FIG. 14 illustrates a cell swap method based on a design layout of a circuit, in accordance with some embodiments of the present teaching.

FIG. 14 illustrates a cell swap method based on a design layout of a circuit, in accordance with some embodiments of the present teaching. As shown in FIG. 14, the circuit 1410 before cell swap has two A2 pins 1432, 1442 too close to each other. Because the two A2 pins 1432, 1442 belong to two adjacent cells, one of the two adjacent cells, e.g. the cell 1430, can be swapped such that the A2 pin 1432 of the cell 1430 is changed from front side routing to back side routing, without changing the routings of the other I/O pins in the cell 1430. Then, after cell swap, the two A2 pins 1432, 1442 are not close to each other, since the A2 pin 1432 has been swapped to the back side of the circuit 1420, to solve the pin access issue. As such, the cell swap performed on a cell can be a change of routing for any one or more of the I/O pins of the cell.

Figure 15:
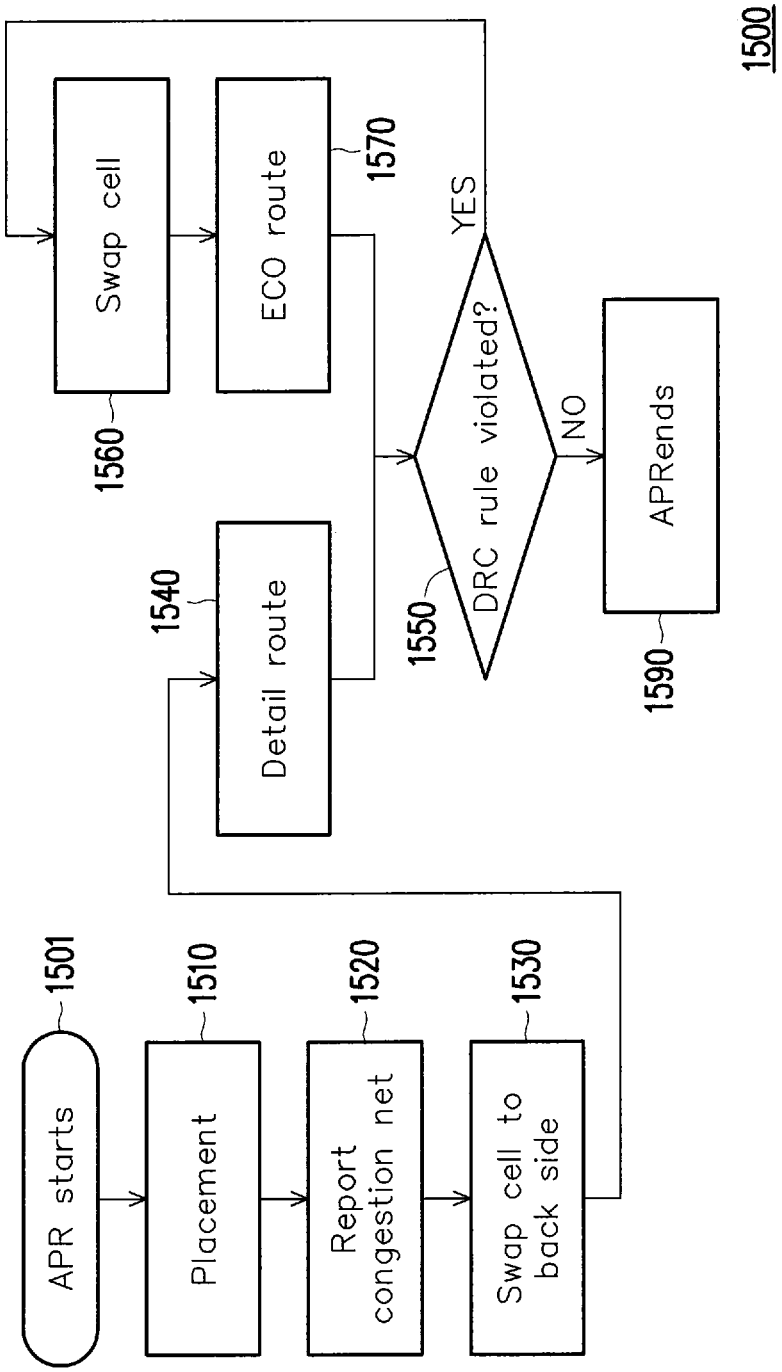
FIG. 15 illustrates a flow diagram of a method for automatically generating a physical layout of a high density circuit design, in accordance with some embodiments of the present teaching.

FIG. 15 illustrates a flow diagram of an automatic place and route (APR) method 1500 for automatically generating a physical layout of a high density circuit design, in accordance with some embodiments of the present teaching. The APR method 1500 starts at operation 1501. At operation 1510, each cell structure of the circuit is placed in an allocated location on a semiconductor substrate based on a circuit design. At operation 1520, it is determined that the circuit has a routing congestion issue, e.g. due to all cells routed from the front side. Then at operation 1530, some cells are swapped from front side routing to back side routing, to satisfy the routing congestion requirement of the circuit design.

At operation 1540, a detail route is performed to generate a connection routing layout for the circuit placed on the semiconductor substrate. Then at operation 1550, a design rule check (DRC) is performed to determine whether a design rule is violated. In some embodiments, the design rule is violated when a distance between two I/O pins of two adjacent cell structures respectively is smaller than a predetermined threshold. In some embodiments, the design rule is violated when a distance between two metal 1 lines electrically connected to two adjacent cell structures respectively is smaller than a predetermined threshold to cause pin access issue.

When the DRC rule is violated, the process goes to operation 1560 to perform a cell swap on one of the two adjacent cells, such that: at least one I/O pin of the swapped cell is routed from one of the back side and the front side of the circuit before the cell swap, and is then routed from the other one of the back side and the front side of the circuit after the cell swap. Then, at operation 1570, an engineering change order (ECO) route is performed to generate a connection routing layout for the circuit placed on the semiconductor substrate after the cell swap. While a detail route at operation 1540 is routing for the entire design, the ECO route at operation 1570 is routing only for those nets that need to be fixed. Then it is determined again whether the DRC rule is violated at operation 1550. When no DRC rule is violated, the APR method ends at operation 1590.

Figure 16:
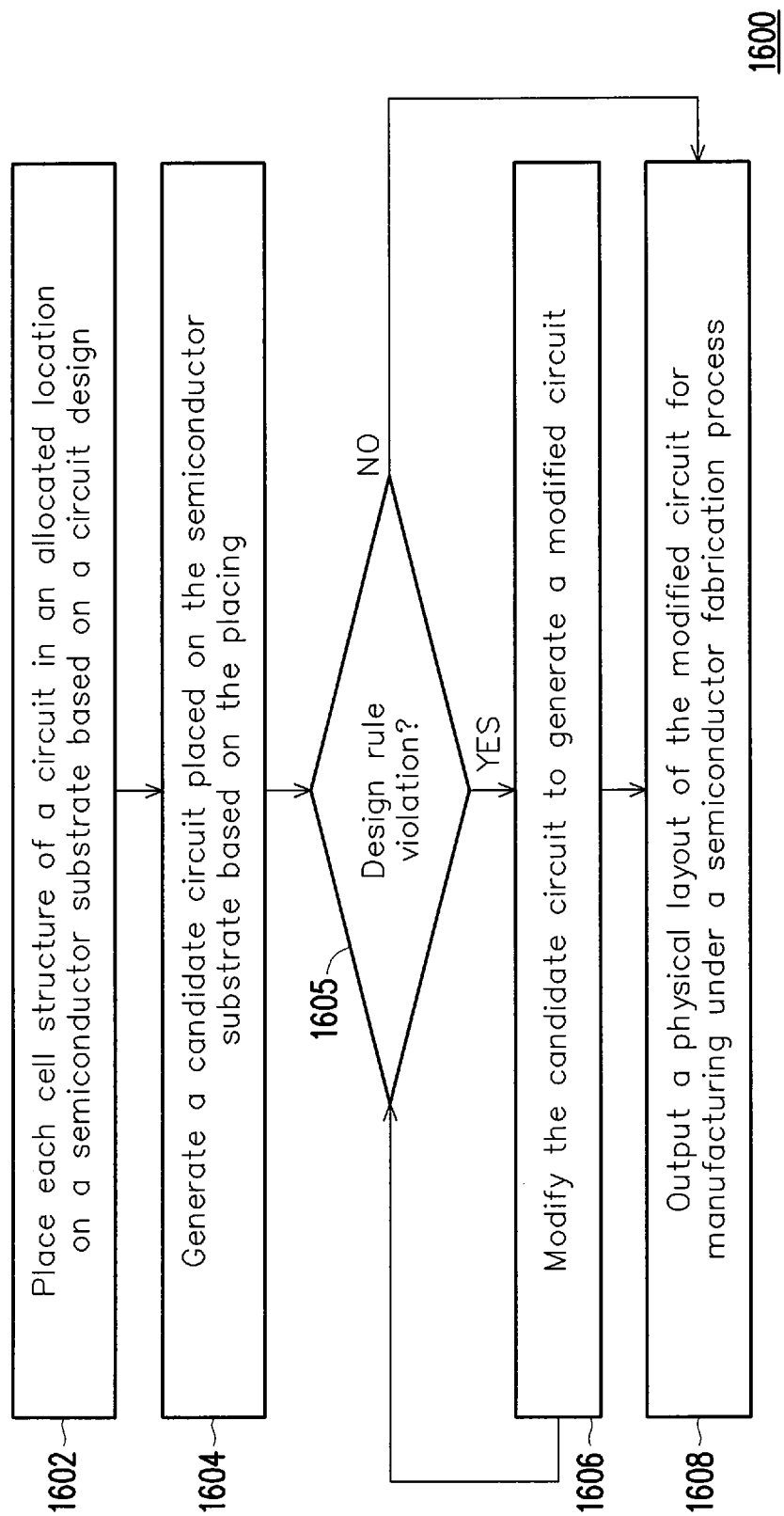
FIG. 16 illustrates a flow diagram of a method for generating a physical layout of a circuit with a high density routing, in accordance with some embodiments of the present teaching.

FIG. 16 illustrates a flow diagram of a method 1600 for generating a physical layout of a circuit with a high density routing, in accordance with some embodiments of the present teaching. At operation 1602, each cell structure of a circuit is placed in an allocated location on a semiconductor substrate based on a circuit design. At operation 1604, a candidate circuit placed on the semiconductor substrate is generated based on the placing. At operation 1605, it is determined whether a design rule is violated based on the circuit design. If so, the process goes to operation 1606 to modify the candidate circuit to generate a modified circuit, and the process goes back to operation 1605 to check again whether any design rule is violated. If no design rule is violated at operation 1605, the process goes to operation 1608 to output a physical layout of the modified circuit for manufacturing under a semiconductor fabrication process.

FIG. 17 illustrates a flow diagram of a method 1700 for forming a semiconductor device with metal lines on both sides, in accordance with some embodiments of the present teaching. At operation 1702, a gate structure is formed on a substrate that is located at a back side of a semiconductor structure. At operation 1704, a first dielectric layer is deposited on the gate structure. At operation 1706, the first dielectric layer is etched to form at least one first via in the first dielectric layer. At operation 1708, a plurality of first metal lines is formed at a front side of the semiconductor structure over the first dielectric layer, wherein each of the at least one first via is electrically connected to the gate structure and a corresponding one of the plurality of first metal lines. At operation 1710, the semiconductor structure is turned upside down. At operation 1712, a second dielectric layer is formed at the back side of the semiconductor structure. At operation 1714, the second dielectric layer is etched to form at least one second via in the second dielectric layer. At operation 1716, a plurality of second metal lines is formed at the back side of the semiconductor structure, wherein each of the at least one second via is electrically connected to the gate structure and a corresponding one of the plurality of second metal lines.

In an embodiment, a semiconductor structure is disclosed. The semiconductor structure includes: a gate structure; a plurality of first metal lines formed in a first dielectric layer below the gate structure; at least one first via formed in a second dielectric layer that is between the gate structure and the first dielectric layer; a plurality of second metal lines formed in a third dielectric layer over the gate structure; and at least one second via formed in a fourth dielectric layer that is between the gate structure and the third dielectric layer. Each of the at least one first via is electrically connected to the gate structure and a corresponding one of the plurality of first metal lines. Each of the at least one second via is electrically connected to the gate structure and a corresponding one of the plurality of second metal lines.

In another embodiment, an integrated circuit (IC) comprising a plurality of cell structures is disclosed. Each of the plurality of cell structures comprises: a plurality of input/output (I/O) pins, an active region, a plurality of first metal lines formed at a back side of the IC and below the active region, and a plurality of second metal lines formed at a front side of the IC and over the active region. At least one I/O pin of at least one of the plurality of cell structures is routed from the back side of the IC. At least one I/O pin of at least one of the plurality of cell structures is routed from the front side of the IC.

In yet another embodiment, a method for generating a physical layout of a circuit that comprises a plurality of cell structures is disclosed. The method includes: placing each cell structure of the circuit in an allocated location on a semiconductor substrate based on a circuit design, wherein each cell structure comprises: a plurality of input/output (I/O) pins, an active region, a plurality of first metal lines formed at a back side of the circuit and below the active region, and a plurality of second metal lines formed at a front side of the circuit and over the active region; generating a candidate circuit placed on the semiconductor substrate based on the placing; modifying the candidate circuit when the candidate circuit violates at least one of the following of the circuit design: a routing congestion requirement or a pin access requirement, to generate a modified circuit; and outputting a physical layout of the modified circuit for manufacturing under a semiconductor fabrication process.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the broadest scope consistent with the novel features and principles disclosed herein.

What is claimed is:

1. A semiconductor structure, comprising:
a gate structure;
a plurality of first metal lines formed in a first dielectric layer below the gate structure, wherein the plurality of first metal lines is at a back side of a standard cell;
at least one first via formed in a second dielectric layer that is between the gate structure and the first dielectric layer, wherein each of the at least one first via is electrically connected to the gate structure and a corresponding one of the plurality of first metal lines;
a plurality of second metal lines formed in a third dielectric layer over the gate structure, wherein the plurality of second metal lines is at a front side of the standard cell, wherein:
the standard cell is a device with a plurality of input/output (I/O) pins,
at least one first pin of the plurality of I/O pins is routed from the back side of the standard cell, wherein the at least one first pin toggles between a power supply voltage level and a ground voltage level when the device is powered on, and
at least one second pin of the plurality of I/O pins is routed from the front side of the standard cell, wherein the at least one second pin toggles between the power supply voltage level and the ground voltage level when the device is powered on; and
at least one second via formed in a fourth dielectric layer that is between the gate structure and the third dielectric layer, wherein each of the at least one second via is electrically connected to the gate structure and a corresponding one of the plurality of second metal lines.

2. The semiconductor structure of claim 1, wherein the plurality of first metal lines are formed perpendicular to the gate structure.

3. The semiconductor structure of claim 1, wherein the plurality of second metal lines are formed in parallel with the plurality of first metal lines.

4. The semiconductor structure of claim 1, wherein the gate structure is a gate structure of a complementary field-effect transistor.

5. The semiconductor structure of claim 1, wherein:
the gate structure is a gate structure for a first transistor of a first type and a second transistor of a second type;
the second transistor is positioned vertically above the first transistor; and
the first type and the second type are opposite types.

6. The semiconductor structure of claim 1, wherein:
the plurality of first metal lines comprise metal 0 lines; and
the plurality of second metal lines comprise metal 0 lines.

7. The semiconductor structure of claim 6, wherein:
the standard cell is a device with five input/output (I/O) pins;
at least one of the five I/O pins is routed from the back side of the standard cell; and
at least one of the five I/O pins is routed from the front side of the standard cell.

8. The semiconductor structure of claim 6, wherein:
the standard cell is a device with a plurality of input/output (I/O) pins; and
at least one third pin of the plurality of I/O pins is routed from both the back side and the front side of the standard cell.

9. The semiconductor structure of claim 1, wherein:
the standard cell is an inverter with two input/output (I/O) pins.

10. The semiconductor structure of claim 9, wherein:
one of the two I/O pins is routed from the back side of the standard cell; and
the other one of the two I/O pins is routed from the front side of the standard cell.

11. A semiconductor structure, comprising:
a gate structure;
a plurality of first metal lines formed in a first dielectric layer below the gate structure, wherein the plurality of first metal lines is at a back side of an inverter cell with two input/output (I/O) pins;
at least one first via formed in a second dielectric layer that is between the gate structure and the first dielectric layer, wherein each of the at least one first via is electrically connected to the gate structure and a corresponding one of the plurality of first metal lines;
a plurality of second metal lines formed in a third dielectric layer over the gate structure, wherein the plurality of second metal lines is at a front side of the inverter cell, wherein:
a first pin of the two I/O pins is routed from the back side of the inverter cell, wherein the first pin toggles between a power supply voltage level and a ground voltage level when the inverter cell is powered on, and
a second pin of the two I/O pins is routed from the front side of the inverter cell, wherein the second pin toggles between the power supply voltage level and the ground voltage level when the inverter cell is powered on; and
at least one second via formed in a fourth dielectric layer that is between the gate structure and the third dielectric layer, wherein each of the at least one second via is electrically connected to the gate structure and a corresponding one of the plurality of second metal lines.

12. The semiconductor structure of claim 11, wherein the plurality of first metal lines are formed perpendicular to the gate structure.

13. The semiconductor structure of claim 11, wherein the plurality of second metal lines are formed in parallel with the plurality of first metal lines.

14. The semiconductor structure of claim 11, wherein the gate structure is a gate structure of a complementary field-effect transistor.

15. The semiconductor structure of claim 11, wherein:
the gate structure is a gate structure for a first transistor of a first type and a second transistor of a second type;
the second transistor is positioned vertically above the first transistor; and
the first type and the second type are opposite types.

16. A semiconductor structure, comprising:
   a plurality of gate structures;
   a plurality of first metal lines formed in a first dielectric layer below the plurality of gate structures, wherein the plurality of first metal lines is at a back side of an integrated circuit (IC) with a plurality of input/output (I/O) pins;
   at least one first via formed in a second dielectric layer that is between the plurality of gate structures and the first dielectric layer, wherein each of the at least one first via is electrically connected to the plurality of gate structures and a corresponding one of the plurality of first metal lines;
   a plurality of second metal lines formed in a third dielectric layer over the plurality of gate structures, wherein the plurality of second metal lines is at a front side of the IC, wherein:
      at least one first pin of the plurality of I/O pins is routed from the back side of the IC, wherein the at least one first pin toggles between a power supply voltage level and a ground voltage level when the IC is powered on, and
      at least one second pin of the plurality of I/O pins is routed from the front side of the IC, wherein the at least one second pin toggles between the power supply voltage level and the ground voltage level when the IC is powered on; and
   at least one second via formed in a fourth dielectric layer that is between the plurality of gate structures and the third dielectric layer, wherein each of the at least one second via is electrically connected to the plurality of gate structures and a corresponding one of the plurality of second metal lines.

17. The semiconductor structure of claim 16, wherein the plurality of first metal lines are formed perpendicular to each of the plurality of gate structures.

18. The semiconductor structure of claim 16, wherein the plurality of second metal lines are formed in parallel with the plurality of first metal lines.

19. The semiconductor structure of claim 16, wherein at least one of the plurality of gate structures is a gate structure of a complementary field-effect transistor.

20. The semiconductor structure of claim 16, wherein:
   at least one of the plurality of gate structures is a gate structure for a first transistor of a first type and a second transistor of a second type;
   the second transistor is positioned vertically above the first transistor; and
   the first type and the second type are opposite types.

* * * * *